(12) United States Patent
Harai et al.

(10) Patent No.: US 9,018,836 B2
(45) Date of Patent: *Apr. 28, 2015

(54) SURFACE LIGHT SOURCE DEVICE AND LIGHTING APPARATUS

(75) Inventors: Kenichi Harai, Tokyo (JP); Hiroyasu Inoue, Tokyo (JP)

(73) Assignee: Zeon Corporation, Tokyo (JP)

( * ) Notice: Subject to any disclaimer, the term of this patent is extended or adjusted under 35 U.S.C. 154(b) by 108 days.

This patent is subject to a terminal disclaimer.

(21) Appl. No.: 13/703,546

(22) PCT Filed: Jun. 23, 2011

(86) PCT No.: PCT/JP2011/064475
§ 371 (c)(1),
(2), (4) Date: Dec. 11, 2012

(87) PCT Pub. No.: WO2012/002259
PCT Pub. Date: Jan. 5, 2012

(65) Prior Publication Data
US 2013/0087777 A1    Apr. 11, 2013

(30) Foreign Application Priority Data
Jun. 29, 2010  (JP) ................................. 2010-147787

(51) Int. Cl.
H01J 63/04    (2006.01)
H01L 51/50    (2006.01)
H01L 51/52    (2006.01)

(52) U.S. Cl.
CPC ..... *H01L 51/5012* (2013.01); *H01L 2251/5361* (2013.01); *H01L 51/5262* (2013.01); *H01L 2251/5323* (2013.01)

(58) Field of Classification Search
None
See application file for complete search history.

(56) References Cited

U.S. PATENT DOCUMENTS 8,123,321 B2   2/2012  Kuiseko et al.
8,866,130 B2 * 10/2014  Harai .............................. 257/40
(Continued)

FOREIGN PATENT DOCUMENTS

JP   2009-211886 A   9/2009
JP   2009-266429 A   11/2009
(Continued)

OTHER PUBLICATIONS

International Search Report for PCT/JP2011/064475 dated Sep. 27, 2011.
(Continued)

*Primary Examiner* — David Vu
*Assistant Examiner* — Cuong B Nguyen
(74) *Attorney, Agent, or Firm* — Birch, Stewart, Kolasch & Birch, LLP

(57) ABSTRACT

A surface light source device including an organic EL element of a double-side emission type and a light output surface structure layer provided on at least one surface of the organic EL element, wherein the light output surface structure layer includes a concavo-convex structure on a surface opposite to the organic electroluminescent element, the concavo-convex structure having flat surface portions parallel to the surface and an inclined surface portion tilted relative to the flat surface portions, and a projected area formed by projecting the inclined surface portion in a direction perpendicular to the flat surface portions onto a plane parallel to the flat surface portions is not more than 0.1 times a total area of the flat surface portions.

5 Claims, 10 Drawing Sheets

(56) References Cited

U.S. PATENT DOCUMENTS

| | | |
|---|---|---|
| 2003/0057417 A1 | 3/2003 | Lee et al. |
| 2004/0017153 A1 | 1/2004 | Nishikawa |
| 2008/0182076 A1 | 7/2008 | Kondo et al. |

FOREIGN PATENT DOCUMENTS

| | | |
|---|---|---|
| JP | 2010-27428 A | 2/2010 |
| JP | 2010-49820 A | 3/2010 |
| JP | 2010-97711 A | 4/2010 |
| JP | 2010-123322 A | 6/2010 |
| JP | 2011-159480 A | 8/2011 |
| WO | WO 2008/020514 A1 | 2/2008 |

OTHER PUBLICATIONS

Chinese Office Action issued in Chinese Patent Application No. 201180030646.9 on Jan. 14, 2015.

* cited by examiner

SURFACE LIGHT SOURCE DEVICE AND LIGHTING APPARATUS

FIELD

The present invention relates to a surface light source device. More particularly, the invention relates to a surface light source device which includes an organic electroluminescent element (hereinafter referred to as the "organic EL element" when appropriate).

BACKGROUND

An organic EL element includes an organic light-emitting layer between a plurality of layers of electrodes to electrically obtain light emission. In addition to the use thereof as a display device as a replacement for liquid crystal cells, the organic EL element has also been studied for applications as a surface light source device such as a flat-type lighting apparatus and a liquid crystal display backlight, utilizing characteristics such as high emission efficiency, low voltage driving, light weight, and low cost.

When using an organic EL element as a light source of a surface light source device, light has to be extracted from the surface light source device in a useful manner with high efficiency. To this end, in prior art surface light source devices, it is known to provide a variety of concavo-convex structures on the light output surface side of the organic EL element. A lot of studies have been made regarding such concavo-convex structures for surface light source devices, particularly devices of single-side emission type where light is extracted from one side (for example, FIGS. 4 and 6 of Patent Literature 1, etc.).

CITATION LIST

Patent Literature

Patent Literature 1: Japanese Patent Application Laid-Open No. 2009-266429 A

SUMMARY

Technical Problem

The surface light source devices with an organic EL element include the surface light source device of a double-side emission type, which extracts light from both sides, in addition to that of the single-side emission type. Since the double-side emission type surface light source device is also required to extract light with high efficiency, the inventor attempted to provide the double-side emission type surface light source device with the concavo-convex structure in the same manner as for the single-side emission type surface light source device. However, it was found out that the desired performance is not achievable merely by applying the concavo-convex structure of the single-side emission type surface light source device, without any modification, to the double-side emission type surface light source device.

Usually, each layer constituting the double-side emission type surface light source device is capable of transmitting light. Accordingly, the typical double-side emission type surface light source device is adapted to have a see-through feature. That is, such a double-side emission type surface light source device can be seen through. Since the see-through feature can improve quality of design and diversify varieties of usages available, having the see-through feature is one of the advantages of the double-side emission type surface light source device. It is thus desirable to keep the feature of allowing the viewer to see through the light-emitting device even when the concavo-convex structure is provided in order to extract light with high efficiency.

On the other hand, from the perspective of enhancing the light extraction efficiency, the single-side light emission type surface light source device is provided with a reflecting layer (for example, a reflecting electrode), so that the reflecting layer reflects light emitted from the organic EL element to the side that is opposite to the light output surface. Accordingly, since the light which has entered into the single-side light emission type surface light source device from outside will also be reflected on the reflecting layer, the surface light source device cannot be seen through. For these reasons, in general, a conventional concavo-convex structure provided to the single-side light emission type surface light source device has not been studied concerning the see-through feature for the double-side emission type surface light source device. Accordingly, provision of the conventional concavo-convex structure on the double-side emission type surface light source device usually increases haze so as not to allow the surface light source device to be seen through.

The present invention was developed in view of the aforementioned problems. It is therefore an object of the present invention to provide a surface light source device which enables light to be extracted therefrom with high efficiency while maintaining the see-through feature.

Solution to Problem

As the results of intensive studies conducted aiming at solving the aforementioned problems, the inventor found out the following. That is, it was found out that a surface light source device having a concavo-convex structure on a light output surface thereof could be implemented so as to enable light to be extracted therefrom with high efficiency, while maintaining the see-through feature, by controlling the area ratio between the flat surface portion and the inclined surface portion of the concavo-convex structure. The present invention has thereby been completed.

More specifically, according to the present invention, there are provided the following [1] to [5]:

(1) A surface light source device comprising: an organic electroluminescent element of a double-side emission type having a first transparent electrode layer, a light-emitting layer, and a second transparent electrode layer provided in this order; and a light output surface structure layer provided directly or indirectly on at least one surface of the organic electroluminescent element, wherein the light output surface structure layer includes a concavo-convex structure on a surface opposite to the organic electroluminescent element, the concavo-convex structure having flat surface portions parallel to one surface of the organic electroluminescent element and an inclined surface portion tilted relative to the flat surface portions, and a projected area formed by projecting the inclined surface portion in a direction perpendicular to the flat surface portions onto a plane parallel to the flat surface portions is not more than 0.1 times a total area of the flat surface portions.

(2) The surface light source device according to (1), wherein a maximum value of height differences between the flat surface portions in the concavo-convex structure is not more than 12 μm.

(3) The surface light source device according to (1) or (2), wherein the inclined surface portion is tilted at an inclination angle of not less than 80° and less than 90° relative to the flat surface portions.
(4) The surface light source device according to any one of (1) to (3), wherein a height difference between the flat surface portions is not less than 0.1 µm.
(5) A lighting apparatus comprising the surface light source device according any one of (1) to (4).

Advantageous Effects of Invention

According to the surface light source device of the present invention, it is possible to extract light with high efficiency while maintaining the see-through feature.

DESCRIPTION OF EMBODIMENTS

The present invention will be described in more detail hereinbelow with reference to the embodiments and illustrations; however, the present invention will not be limited to the embodiments and illustrations to be shown below, and may be appropriately modified without departing from the scope of the appended claims and the scope of the equivalents thereof.

1. First Embodiment

Figure 1:
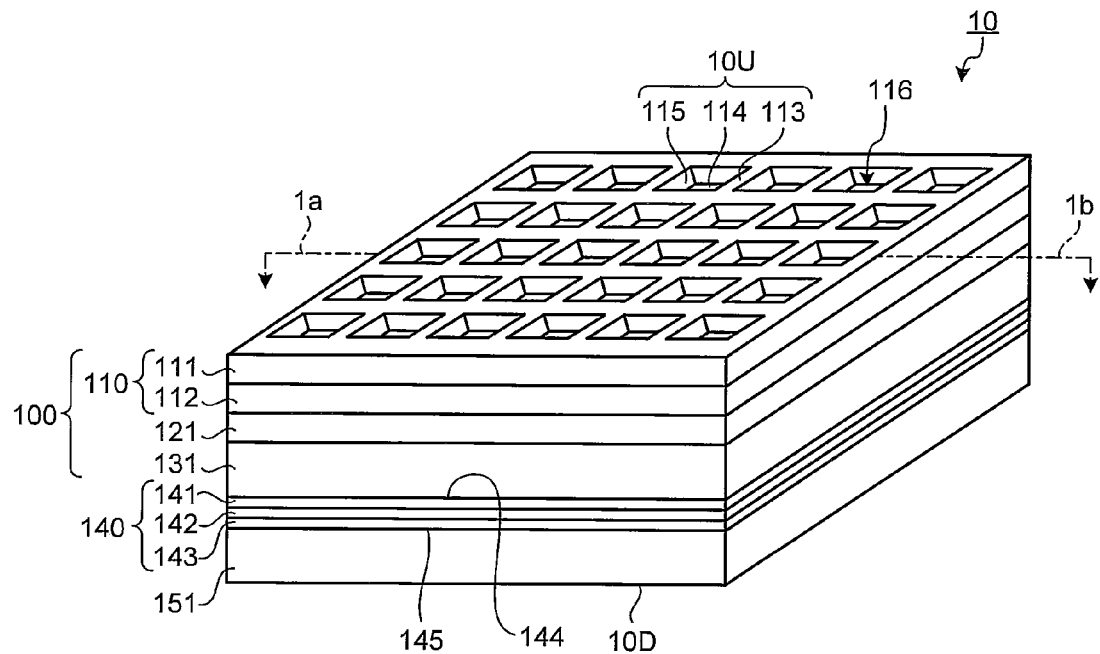
FIG. 1 is a perspective view schematically illustrating a surface light source device according to a first embodiment of the present invention.
Figure 2:
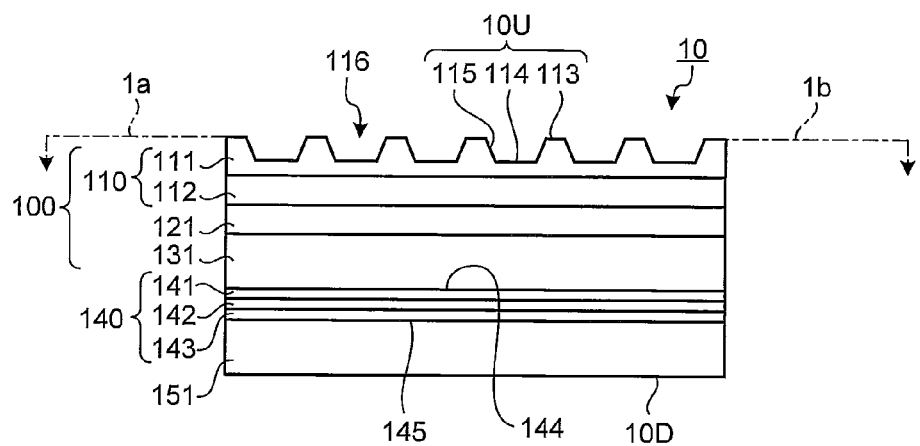
FIG. 2 is a cross-sectional view schematically illustrating the surface light source device according to the first embodiment of the present invention, the cross section thereof cutting the surface light source device shown in FIG. 1 along a plane passing through line 1a-1b and perpendicular to a light output surface.

FIGS. 1 and 2 are each an explanatory view illustrating a surface light source device according to a first embodiment of the present invention. FIG. 1 is a perspective view schematically illustrating the surface light source device. FIG. 2 is a schematic cross-sectional view illustrating a cross section of the surface light source device of FIG. 1, the cross section being along a plane passing through line 1a-1b and perpendicular to a light output surface.
As shown in FIG. 1, the surface light source device 10 according to the first embodiment of the present invention is a device having a rectangular flat-shaped structure, and includes an organic EL element 140 of double-side emission type, and a light output surface structure layer 100 which is directly or indirectly provided on at least either one of the surfaces of the organic EL element 140. The organic EL element 140 includes at least a first transparent electrode layer 141, a light-emitting layer 142, and a second transparent electrode layer 143 in this order, and is configured to be able to emit light from both surfaces 144 and 145. In the present embodiment, since the first transparent electrode layer 141 and the second transparent electrode layer 143 are transparent electrode layers, the light from the light-emitting layer 142 can pass through the first electrode layer 141 and the second electrode layer 143 to be emitted from the surfaces 144 and 145. In the following description, the surfaces 144 and 145 will therefore be referred to as "light-emitting surfaces".

As mentioned previously, the light output surface structure layer 100 is provided on the light-emitting surface 144 of the organic EL element 140. In the present embodiment, the light output surface structure layer 100 is directly provided in contact with the light-emitting surface 144.

The surface light source device 10 of this embodiment may further include a component other than the aforementioned members. In this embodiment, a sealing substrate 151 is provided on the light-emitting surface 145 of the organic EL element 140.

Accordingly, the surface light source device 10 includes the sealing substrate 151, the organic EL element 140, and the light output surface structure layer 100 in this order. From such a surface light source device 10, light goes out from a surface 10U of the light output surface structure layer 100 opposite to the organic EL element 140, whereas light also goes out from a surface 10D of the sealing substrate 151, wherein the surface 10D is a surface opposite to the organic EL element 140. The surfaces 10U and 10D are located at the outermost positions of the surface light source device 10 and light goes out of the surface light source device 10 through the surfaces 10U and 10D. Thus the surfaces 10U and 10D may be referred to as the "light output surface".

[1-1. Organic EL Element]

As exemplified as the organic EL element 140, the organic EL element is usually made up of two or more electrode layers, and a light-emitting layer disposed between these electrode layers so as to emit light upon application of a voltage from the electrodes.

The organic EL element is usually constructed such that layers, such as the electrode and the light-emitting layer which constitute the organic EL element, are formed on a substrate, and a sealing member is provided to cover those layers, whereby the layers such as the light-emitting layer are sealed between the substrate and the sealing member.

There is no particular limitation on the light-emitting layer. The light-emitting layer may be appropriately chosen from among known ones. The light-emissive material of the light-emitting layer to be employed is not limited to one type, but may be of two or more types combined at any ratio. Furthermore, the light-emitting layer is not limited to one layer, but may be a single layer of one type or a combination of layers of a plurality of types so as to be fit for use as a light source. This allows the light-emitting layer to emit light of white color or a color close thereto.

In the present invention, the electrode layers constituting the organic EL element are each a transparent electrode layer which is formed of a transparent material. As used herein, the expression "being transparent" means having a level of light transmittance that is suitable for use as an optical member. For example, an electrode having a light transmittance that is high enough to allow the surface light source device 10 as an entire device to have a desired total light transmittance, which will be discussed later, may be employed as a transparent electrode layer. Provision of the transparent electrode layer having a high transparency allows the extraction efficiency of light generated in the light-emitting layer to be enhanced, while allowing an observer to clearly see through the surface light source device. The transparent electrode layer may be formed of a single material of one type or two or more types of materials combined at any ratio. Furthermore, the transparent electrode layer may have a single-layered structure with only one layer or a multi-layered structure with two or more layers.

In addition to the light-emitting layer 142, the organic EL element 140 may also have another layer (not shown) such as a hole injection layer, a hole transport layer, an electron transport layer, and an electron injection layer between the first transparent electrode layer 141 and the second transparent electrode layer 143. Furthermore, the organic EL element 140 may also include an optional component such as wiring for applying electricity to the first transparent electrode layer 141 and the second transparent electrode layer 143, and a peripheral structure for sealing the light-emitting layer 142.

The materials for forming the transparent electrode layers and the layers provided therebetween are not limited to a particular one, and specific examples thereof may include the following.

Examples of the material for the transparent electrode layer may include indium tin oxide (ITO).

Examples of the material for the hole injection layer may include a starburst-based aromatic diamine compound.

Examples of the material for the hole transport layer may include a triphenyl diamine derivative.

Examples of the host material for a yellow light-emitting layer may include a triphenyl diamine derivative, while examples of the dopant material for the yellow light-emitting layer may include a tetracene derivative.

Examples of the material for a green light-emitting layer may include a pyrazoline derivative.

Examples of the host material for a blue light-emitting layer may include an anthracene derivative, while examples of the dopant material for the blue light-emitting layer may include a perylene derivative.

Examples of the material for a red light-emitting layer may include a europium complex.

Examples of the material for the electron transport layer may include an aluminum quinoline complex (Alq).

It is also acceptable to appropriately combine the aforementioned light-emitting layers or other light-emitting layers to obtain a light-emitting layer, referred to as a multi-layer type or tandem type, which emits light having complementary colors. The combination of complementary colors may be, for example, yellow/blue or green/blue/red.

[1-2. Light Output Surface Structure Layer]

The light output surface structure layer 100 has the light output surface 10U located on the outermost side of the surface light source device 10. The light output surface 10U is a surface opposite to the organic EL element 140 of the light output surface structure layer 100 and serves as a light output surface of the surface light source device 10, i.e., the light output surface through which light exits outwardly from the surface light source device 10.

When viewed macroscopically, the light output surface 10U is parallel to the light-emitting surface 144 of the organic EL element 140 and parallel to the principal plane of the surface light source device 10. However, when viewed microscopically, the light output surface 10U has a concavo-convex structure which will be described later, and therefore the surface on the concave portion or convex portion may form a non-parallel angle relative to the light-emitting surface 144. Therefore, as used in the following descriptions, the expression "being parallel to" or "being perpendicular to" the light output surface means, unless otherwise specified, to be parallel to or to be perpendicular to the light output surface, respectively, when viewed macroscopically with the concave portion and the convex portion ignored. Furthermore, unless otherwise specified, the description will be made to the surface light source device 10, with the light output surface 10U placed to be parallel to the horizontal direction and oriented upward.

Further, the expression that a component member is "parallel" or "perpendicular" may tolerate a range of error which may not compromise the effects of the present invention, for example, within a range of ±5°.

The light output surface structure layer 100 includes: a multi-layered body 110 which includes a concavo-convex structure layer 111 and a substrate film layer 112; a supporting substrate 131 as a substrate; and an adhesive layer 121 for bonding the multi-layered body 110 and the supporting substrate 131 together.

The concavo-convex structure layer 111 is located on one surface of the surface light source device 10 (i.e., the outermost layer on one light output surface of the surface light source device 10; that is illustrated on the upper side in the figure). The light output surface 10U, i.e., the surface of the concavo-convex structure layer 111 has a concavo-convex structure formed thereon. As will be discussed in more detail later, the concavo-convex structure has a flat surface portions 113 and 114, which are parallel to the light-emitting surface 144 of the organic EL element 140, and the inclined surface portion 115 which is tilted relative to the flat surface portions 113 and 114.

Specifically, the light output surface 10U of the concavo-convex structure layer 111 includes a plurality of concave portions 116 which have a flat surface portion 114 as the bottom surface and inclined surface portions 115 as side surfaces, and flat surface portions 113 which are gap portions between adjacent concave portions 116. As used herein, the expression, "the inclined surface portion is tilted relative to the flat surface portion" means that the inclined surface portion is not parallel to the flat surface portion.

Since the drawings in this specification are schematic illustrations, only a small number of the concave portions 116 are shown on the light output surface 10U. However, in an actual surface light source device, a far larger number of the concave portions may be provided on the light output surface of one surface light source device.

[Description of Concavo-Convex Structure Layer]

The concavo-convex structure of the light output surface 10U will be described hereinbelow in more detail with reference to the drawings.

Figure 3:
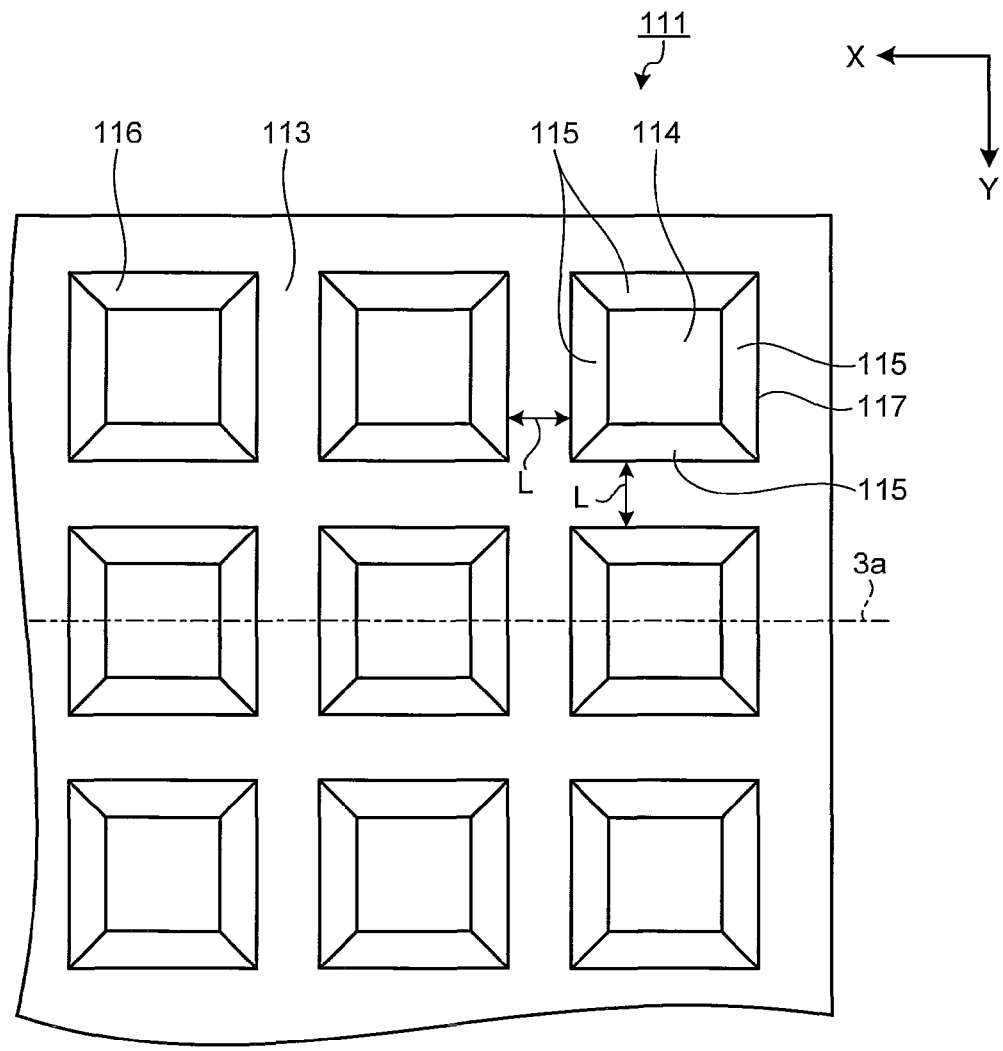
FIG. 3 is an enlarged partial plan view schematically illustrating a part of the light output surface of the surface light source device according to the first embodiment of the present invention when viewed in the thickness direction of the surface light source device.
Figure 4:
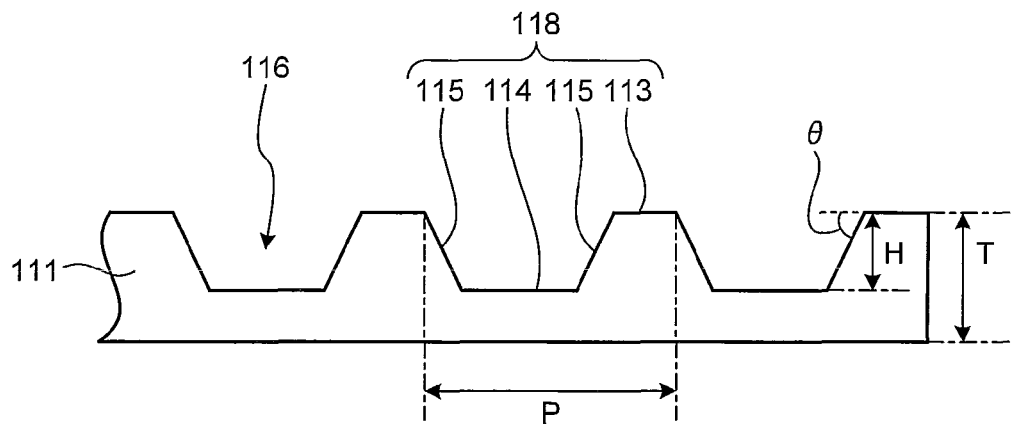
FIG. 4 is a partial cross-sectional view schematically illustrating a cross section of the concavo-convex structure layer according to the first embodiment of the present invention, the cross section thereof being along a plane passing through line 3a shown in FIG. 3 and perpendicular to the light output surface.

FIG. 3 is an enlarged partial plan view schematically illustrating a part of the light output surface 10U of the surface light source device 10 when viewed in the thickness direction of the surface light source device 10. FIG. 4 is a partial cross-sectional view schematically illustrating a cross section of the concavo-convex structure layer 111, wherein the cross section is along a plane passing through line 3a of FIG. 3 and perpendicular to the light output surface 10U. The aforementioned line 3a passes over all the flat surface portions 114 of the concave portions 116 in one line. Unless otherwise specified, "the thickness direction" in the following description refers to the thickness direction of the surface light source device.

As shown in FIG. 3, the light output surface 10U includes a plurality of the concave portions 116 and the flat surface portions 113 which are the gap portions between the concave portions 116. Each concave portion 116 is in a shape of a square pyramid truncated in parallel to the bottom surface (prismoidal shape). Each concave portion 116 includes a rectangular flat surface portion 114 that is the bottom portion and four inclined surface portions 115 extending from the respective four sides of the rectangular shape. More specifically, the flat surface portion 114, i.e. the bottom surface of the concave portion 116, has a square shape. All the four inclined surface portions 115 constituting the concave portion 116 have the same trapezoidal shape. Borders 117 between the inclined surface portions 115 and the flat surface portions 113 form a square. In other words, in the present embodiment, the concave portions 116 have a square prismoidal shape.

The concave portions 116 are usually arranged at discrete positions. In this instance, a plurality of the concave portions 116 are arranged in two mutually-orthogonal directions X and Y that are parallel to the light output surface 10U. Specifically, the concave portions 116 are consecutively arranged along two orthogonal directions X and Y at regular intervals L. In the aforementioned two directions X and Y, gaps are provided between adjacent concave portions 116. These gaps constitute the flat surface portions 113. Consequently, in the light output surface 10U, usually the inclined surface portions 115 are located around the flat surface portions 114, and the flat surface portions 113 are located around the inclined surface portions 115 (and by extension, around the concave portions 116).

Figure 5:
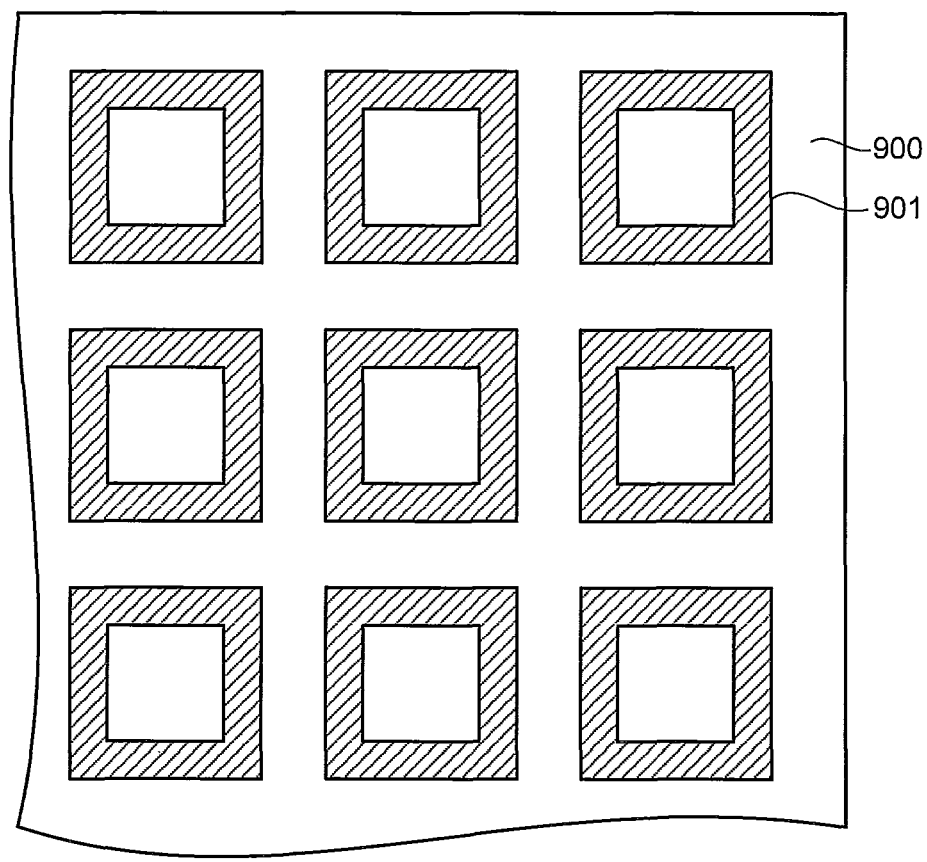
FIG. 5 is a schematic projected view illustrating an inclined surface portion of the light output surface of the surface light source device according to the first embodiment of the present invention when the inclined surface portion is projected onto a plane parallel to a flat surface portion, the projection being effected in a direction perpendicular to the flat surface portion.

FIG. 5 is a schematic projected view illustrating the inclined surface portion 115 of the light output surface 10U of the surface light source device 10, the inclined surface portion 115 being projected in a direction perpendicular to the flat surface portions 113 and 114, onto a plane 900 that is parallel to the flat surface portions 113 and 114. In the present embodiment, the direction perpendicular to the flat surface portions 113 and 114 is consistent with the direction perpendicular to the light output surface 10U and the direction parallel to the thickness direction of the surface light source device 10. Further, the plane 900 parallel to the flat surface portions 113 and 114 is parallel to the light output surface 10U. However, the plane 900 parallel to the flat surface portions 113 and 114 is not a surface that the surface light source device 10 has, but is a plane for projection which is set for measuring the projected area of the inclined surface portion 115. In FIG. 5, shown by being shaded is a projected image 901 obtained by projecting the inclined surface portion 115 of the light output surface 10U of the surface light source device 10, wherein the projection is effected in a direction perpendicular to the flat surface portions 113 and 114 onto the plane 900 parallel to the flat surface portions 113 and 114.

As shown in FIG. 5, for the surface light source device 10 of the present embodiment, the projected area formed by projecting the inclined surface portion 115 in a direction perpendicular to the flat surface portions 113 and 114 onto the plane 900 parallel to the flat surface portions 113 and 114 is usually not more than 0.1 times, preferably not more than 0.05 times, and more preferably not more than 0.01 times the total area of the flat surface portions 113 and 114. Furthermore, the lower limit of the ratio of the projected area of the inclined surface portion 115 relative to the total area of the flat surface portions 113 and 114 is usually not less than 0.0001 times, preferably not less than 0.0005 times, and more preferably not less than 0.001 times.

Since the light output surface 10U has the aforementioned concavo-convex structure, the surface light source device 10 of the present embodiment can provide the following effects (i) to (iii):

(i) When compared to the case without the concavo-convex structure, the surface light source device 10 can have an improved light extraction efficiency from the light output surface 10U. That is, light that otherwise would be internally reflected between the flat surface portions 113 and 114 and fail to be extracted can be extracted through the inclined surface portions 115, whereby the light extraction efficiency can be improved.

(ii) The surface light source device 10 can be seen through. When a conventional concavo-convex structure provided on a surface light source device of single-side emission type is applied to a surface light source device of double-side emission type, the ratio of the inclined surface portions usually increases, which in turn brings about increase in haze, whereby the surface light source device cannot be seen therethrough. In contrast, if the ratio of the projected area of the inclined surface portions 115 relative to the total area of the flat surface portions 113 and 114 falls within the aforementioned range, the haze increase due to the concavo-convex structure when viewed in the direction perpendicular to the light output surface 10U can be suppressed. Consequently, according to the surface light source device 10 of the present embodiment, an increase in haze can be suppressed without impairing the see-through feature even in the presence of the concavo-convex structure.

(iii) Chipping, etc. of the concavo-convex structure due to an external impact can be prevented, whereby mechanical strength of the light output surface 10U can be improved. In general, when an impact is applied to a surface with a concavo-convex structure, part of the concavo-convex structure would tend to be subjected to intensive force and thus easily damaged. However, in the surface light source device 10 of the present embodiment, the levels of the flat surface portions 113 in the thickness direction (when appropriate, this level will be referred to hereinbelow as "height positions") are made even to constitute a uniform flat surface. It is thereby possible to prevent part of the concavo-convex structure layer 111 from being subjected to intensive force due to an external force or impact applied to the light output surface 10U. It is therefore possible to prevent breakage of the concavo-convex structure layer 111, to thereby simultaneously achieve both a good light extraction efficiency and a high mechanical strength of the light output surface 10U of the surface light source device 10.

Further, the maximum value of the height difference H between the flat surface portions 113 and the flat surface portions 114 (in the present embodiment, the depth of the concave portions 116) of the light output surface 10U shown in FIG. 4 is preferably not more than 12 μm, and may be not more than 11 μm, or not more than 10 μm. The lower limit is usually not less than 0.1 μm, and may be not less than 0.15 μm, or not less than 0.2 μm.

When the maximum value of the height difference H between the flat surface portions 113 and 114 falls within such a range, the surface light source device 10 can be seen through even when viewed in a tilted direction (oblique direction) relative to the normal direction of the light output surface 10U. A greater area ratio of the inclined surface portions 115 tends to cause an increase in haze when the light output surface 10U is viewed in an oblique direction. In contrast to this, in an instance wherein the ratio of the projected area of the inclined surface portion 115 relative to the total area (entire area) of the flat surface portions 113 and 114 falls within the aforementioned ranges, when the maximum value of the height differences H of the flat surface portions 113 and 114 falls within the aforementioned ranges, an increase in haze when viewed in an oblique direction can be suppressed. It is thereby possible not to compromise the see-through feature even when the surface light source device 10 is viewed in an oblique direction.

Relative to the flat surface portions 113 and 114, the inclined surface portion 115 is preferably tilted at an inclination angle θ, which is usually not less than 80°, preferably not less than 81°, and more preferably not less than 82°, and usually less than 90°, preferably not more than 89°, and more preferably not more than 88°. That is, the inclined surface portion 115 is not parallel to the flat surface portions 113 and 114, and it is preferable that the angle θ formed between the inclined surface portion 115 and the flat surface portions 113 and 114 falls within the aforementioned ranges. By having such a large inclination angle θ of the inclined surface portion 115, the light extraction efficiency can be enhanced with stability. Furthermore, since a larger inclination angle θ can reduce the projected area per one inclined surface portion 115 when compared an instance with a smaller inclination angle θ, it is possible to see more clearly through the surface light source device 10 when viewed in a direction perpendicular to the light output surface 10U. The direction perpendicular to the light output surface 10U is consistent with the front direction of the surface light source device 10. It is usually expected that the surface light source device 10 is more often seen through in the front direction, and thus the aforementioned advantage is practically useful.

Furthermore, in the present embodiment, although the inclination angle θ of all the inclined surface portions 115 are set to the same magnitude, it may also be set to different magnitudes without particular limitation.

The thickness T of the concavo-convex structure layer 111 may be set to an appropriate range in relation to the aforementioned maximum value of the height difference H between the flat surface portions 113 and 114. For example, if the concavo-convex structure layer 111 is made of a hard material which advantageously maintains the durability of the concavo-convex structure layer 111, the concavo-convex structure layer 111 having a thin thickness T is capable of providing an enhanced flexibility to the surface light source device 10. This preferably facilitates the handling of the concavo-convex structure layer 111 in the manufacturing process of the surface light source device 10. Specifically, the difference between the maximum value of the height difference H between the flat surface portions 113 and 114 and the thickness T of the concavo-convex structure layer 111 is preferably 0 to 30 μm.

As shown in FIG. 3, the light output surface 10U is shaped in such a manner that a repetition structure including the flat surface portions 113 and 114 and two inclined surface portions 115 is repeated in both two directions X and Y. As shown in FIG. 4, a repetition structure 118 including a flat surface portion 113, an inclined surface portion 115, a flat surface portion 114, and an inclined surface portion 115 arranged in this order is repeated in, e.g., the direction X. The repetition structures 118 is repeated at a pitch P of usually not less than 0.1 μm, preferably not less than 0.15 μm, and more preferably not less than 0.2 μm, and usually not more than 500 μm, preferably not more than 450 μm, and more preferably not more than 400 μm. The pitch P which is set to not less than the lower limit of the aforementioned range have the advantage of improving the extraction efficiency. The pitch P which is set to not more than the aforementioned upper limit of the range have the advantage of improving transparency.

The thickness T of the concavo-convex structure layer 111 is preferably, although not particularly limited thereto, 1 μm to 70 μm. In the present embodiment, the thickness T of the concavo-convex structure layer 111 is defined as the distance between the surface thereof on the substrate film layer 112 side on which no concavo-convex structure is formed, and the flat surface portion 113.

The thickness of the substrate film layer 112 is preferably 20 μm to 300 μm.

[Description of Material of Multi-Layered Body]

The light output surface structure layer 100 may be formed of a plurality of layers, but may also be formed of a single layer. From the perspective of easily manufacturing the light output surface structure layer 100 having desired properties, it is preferable that the layer 100 is formed of a plurality of layers. In the present embodiment, as shown in FIG. 1, the light output surface structure layer 100 includes the multi-layered body 110 having the concavo-convex structure layer 111 and the substrate film layer 112 in combination. This makes it possible to readily provide the light output surface structure layer 100 having a high performance.

The concavo-convex structure layer 111 and the substrate film layer 112 may be usually formed of a resin composition containing a transparent resin. In the present embodiment, each layer which constitutes the light output surface structure layer 100 may have a light transmittance which is suitable for use as an optical member, and for example, the light output surface structure layer 100 in its entirety may have a total light transmittance of not less than 80%.

The transparent resin that is the content of the resin composition is not particularly limited and may be of a variety of types of the resins that can form a transparent layer. Examples of the resin may include a thermoplastic resin, a thermosetting resin, a UV curable resin, and an electron-beam curable resin. Of these types of resins, the thermoplastic resin can be easily deformed with heat and the UV curable resin has a high curability and high efficiency. Therefore, these resins are preferred because therewith the concavo-convex structure layer 111 can be efficiently formed.

Examples of the thermoplastic resin may include a polyester-based resin, a polyacrylate-based resin, and a cycloolefin polymer-based resin. Furthermore, examples of the UV curable resin may include an epoxy-based resin, an acrylic-based resin, a urethane-based resin, an ene/thiol-based resin, and an isocyanate-based resin. As these resins, those having a plurality of polymerizable functional groups may be preferably employed. As the resin, one species thereof may be solely used, or two or more species thereof may be used in combination at any ratio.

Of the aforementioned resins, preferable material for the concavo-convex structure layer 111 constituting the multi-layered body 110 are those having a high hardness when cured, from the perspective of easily forming the concavo-convex structure of the light output surface 10U and providing the concavo-convex structure with resistance to abrasion. More specifically, the material may preferably have a pencil hardness of HB or greater, more preferably H or greater, and still more preferably 2H or greater, when formed on a substrate as a resin layer having a thickness of 7 µm with no concavo-convex structure. On the other hand, preferable materials for the substrate film layer 112 are those having a certain extent of flexibility so as to facilitate the handling thereof upon formation of the concavo-convex structure layer 111 and the handling of the multi-layered body 110 after the formation of the multi-layered body 110. A combination of these materials can provide the multi-layered body 110 that can be handled easily and has outstanding durability, and as a result, makes it possible to readily manufacture a high-performance surface light source device 10.

Such a combination of materials may be provided by appropriately selecting the transparent resins among those enumerated above as the resins which constitute the respective materials. More specifically, it is preferable to employ a UV curable resin such as acrylate as the transparent resin that constitutes the material for the concavo-convex structure layer 111, while employing an alicyclic olefin polymer film (for example, ZEONOR film, which will be described later) or polyester film as the transparent resin that constitutes the material for the substrate film layer 112.

As in the present embodiment, when the light output surface structure layer 100 includes the concavo-convex structure layer 111 and the substrate film layer 112, the concavo-convex structure layer 111 and the substrate film layer 112 may be configured so that the refractive indices thereof are as close as possible. In this case, the difference in refractive index between the concavo-convex structure layer 111 and the substrate film layer 112 is preferably within 0.1, and more preferably within 0.05.

The material to be used for the layers which serve as a component of the light output surface structure layer 100 such as the concavo-convex structure layer 111 and the substrate film layer 112 may be a material having optical diffusivity within the ranges of not hampering the see-through feature. This makes it possible to diffuse light passing through the light output surface structure layer 100 while maintaining the see-through feature, thereby further reducing defects such as changes in color tone depending on viewing angles.

Examples of the material having optical diffusivity may include materials containing particles and an alloy resin which contains two or more types of resins mixed together so as to diffuse light. Of those materials having optical diffusivity, from the perspective of readily adjusting the optical diffusiveness, materials containing particles are preferable. In particular, a resin composition containing particles is preferable.

The particles may or may not be transparent. Examples of the material of the particles may include metal, a metal compound, and a resin. Examples of the metal compound may include a metal oxide and a metal nitride. Specific examples of the metal and the metal compound may include a highly reflective metal such as silver or aluminum; and a metal compound such as silicon dioxide, aluminum oxide, zirconium oxide, silicon nitride, tin-doped indium oxide, and titanium oxide. On the other hand, examples of the resin may include a methacrylic resin, a polyurethane resin, and a silicone resin. As the material of particles, one species thereof may be solely used, or two or more species thereof may be used in combination at any ratio.

The shape of particles may be, for example, a spherical shape, a cylindrical shape, a cubic shape, a rectangular shape, a pyramid shape, a conical shape, and a star shape.

Furthermore, if necessary, the resin composition may contain an optional component. Examples of the optional component may include additives such as deterioration inhibitors such as phenol-based or amine-based deterioration inhibitors, antistatic agents such as surface active agent based or siloxane based antistatic agents, and light resistant agents such as triazole-based or 2-hydroxy-benzophenone-based light resistant agents.

[Supporting Substrate]

The surface light source device 10 of the present embodiment includes the supporting substrate 131 between the organic EL element 140 and the multi-layered body 110. The provision of the supporting substrate 131 can give rigidity for suppressing deflection to the surface light source device 10. The supporting substrate 131 to be provided may be a substrate having an outstanding capability of sealing the organic EL element 140 and a capability of allowing sequential formation thereon of the layers which constitute the organic EL element 140 in the manufacturing process. This makes it possible to improve durability of the surface light source device 10 and to facilitate the manufacturing process.

The material to be employed for forming the supporting substrate 131 is usually a transparent material. Examples of the material may include glass and resin. As the material for the supporting substrate 131, one species may be solely used, or two or more species may also be used in combination at any ratio. In the present invention, the transparent material may be those which have a total light transmittance of 80% or greater when the material constitutes a member such as a supporting substrate.

The refractive index of the material which constitutes the supporting substrate 131 is preferably 1.4 to 2.0, although not particularly limited thereto.

The thickness of the supporting substrate 131 is preferably 0.1 mm to 5 mm, though not particularly limited thereto.

[Adhesive Layer]

The surface light source device 10 of the present embodiment includes an adhesive layer 121 between the multi-layered body 110 and the supporting substrate 131. The adhesive layer 121 is interposed between the substrate film layer 112 of the multi-layered body 110 and the supporting substrate 131 in order to bond these two layers together.

The adhesive, i.e., the material for the adhesive layer 121 may include not only an adhesive in a strict sense (with a shear storage elastic modulus of 1 to 500 MPa at 23° C., showing no adhesion at room temperatures, i.e., a so-called hot-melt adhesive) but also an adhesive which has a shear storage elastic modulus of less than 1 MPa at 23° C. More specifically, the adhesive to be appropriately employed may be a material having a refractive index close to that of the supporting substrate 131 or the substrate film layer 112 and having transparency. Specific examples of the adhesive may include an acrylic-based adhesive or tackiness agent. The thickness of the adhesive layer is preferably 5 μm to 100 μm.

[1-3. Sealing Substrate]

The surface light source device 10 of the present embodiment includes a sealing substrate 151 on the light-emitting surface 145. The sealing substrate 151 may be brought into direct contact with the light-emitting surface 145. Alternatively, between the light-emitting surface 145 and the sealing substrate 151, there may exist any substance such as a filler or an adhesive, or a gap. In the gap, there may exist air or other gases so long as no disadvantage is caused, for example, unless the durability of the light-emitting layer 142 is not seriously compromised. Alternatively, the gap may be in vacuo.

As the sealing substrate 151, any member that can seal the organic EL element 140 and can transmit light that has come out of the light-emitting surface 145 may be employed. For example, it is possible to employ the same material as that of the supporting substrate 131.

[1-4. Manufacturing Method]

Although not particularly limited thereto, the surface light source device 10 may be manufactured, e.g., by: a step of forming layers that constitute the organic EL element 140 on one surface of the supporting substrate 131; a step of preparing the multi-layered body 110 having the concavo-convex structure layer 111 and the substrate film layer 112; a step of effecting adhesion of the resulting multi-layered body 110 to the other surface of the supporting substrate 131 via the adhesive layer 121; and a step of providing the sealing substrate 151 on the surface of the organic EL element 140 that is opposite to the supporting substrate 131. Each of the aforementioned steps is not limited to a particular order so long as a desired surface light source device 10 can be obtained.

The multi-layered body 110 having the concavo-convex structure layer 111 and the substrate film layer 112 may be manufactured, for example, by preparing a mold such as a metal mold having a desired shape, and then transferring the mold to a material layer which forms the concavo-convex structure layer 111. Examples of more specific methods may include the following:

[Method 1] Preparing an unworked multi-layered body which has a layer of a resin composition A for constituting the substrate film layer 112 and a layer of a resin composition B for constituting the concavo-convex structure layer 111 (with the concavo-convex structure not yet formed), and then forming the concavo-convex structure on the resin composition B side of the unworked multi-layered body; and

[Method 2] Applying a liquid state resin composition B onto the substrate film layer 112, putting a mold on the layer of the applied resin composition B, and then curing the resin composition B with the mold keeping in that state, to form the concavo-convex structure layer 111.

In Method 1, the unworked multi-layered body may be obtained, for example, by extrusion in which the resin composition A and the resin composition B are co-extruded. The concavo-convex structure may be formed by pushing with a pressure a mold having a desired surface shape against the resin composition B side of the unworked multi-layered body.

More specifically, an elongated unworked multi-layered body is formed continuously by extrusion, and then the unworked multi-layered body is pressed with a transfer roll having a desired surface shape and a nip roll, to thereby perform continuous production in an efficient manner. The nip pressure applied by the transfer roll and the nip roll is preferably a few MPa to a few tens of MPa. The temperature at the time of transfer is preferably not less than Tg and not more than (Tg+100° C.), where Tg is the glass transition temperature of the resin composition B. The duration of contact between the unworked multi-layered body and the transfer roll may be adjusted by the feed speed of the film, i.e., the rotational speed of the roll, and is preferably not shorter than 5 seconds and not longer than 600 seconds.

In Method 2, as the resin composition B for forming the concavo-convex structure layer 111, it is preferable to use a composition which can be cured by energy radiation such as ultraviolet radiation. Such a resin composition B is applied onto the substrate film layer 112, and then a mold is put thereon. Keeping that state, the resin composition B is cured by being irradiated with energy radiation such as ultraviolet radiation from a light source located at the backside of the coated surface (that is, opposite to the surface of the substrate film layer on which the resin composition B has been coated). After that, the mold is removed, to thereby obtain the multi-layered body 110 with the coating of the resin composition B formed as the concavo-convex structure layer 111.

[1-5. Description of Major Advantages]

As the surface light source device 10 of the present embodiment is configured as described above, light emitted from the light-emitting surface 144 of the organic EL element 140 passes through the light output surface structure layer 100 and goes out from the light output surface 10U, whereas light emitted from the light-emitting surface 145 passes through the sealing substrate 151 and goes out from the light output surface 10D. At this time, since the light output surface 10U has the concavo-convex structure having the flat surface portions 113 and 114 as well as the inclined surface portion 115, the light can be extracted from the light output surface 10U with high efficiency.

Furthermore, since all the layers included in the surface light source device 10 are transparent, the surface light source device 10 is configured such that light incident upon one light output surface 10U can pass through the surface light source device 10 and then exit from the other light output surface 10D, whereas light incident upon the other light output surface 10D can also pass through the surface light source device 10 and then exit from the one light output surface 10U. In the present embodiment, haze is suppressed since the ratio of the projected area of the inclined surface portion 115 relative to the total area of the flat surface portions 113 and 114 is restricted within a predetermined range. It is thus possible for viewer's naked eye to clearly see through the surface light source device 10. Therefore it is possible to realize a see-through type surface light source device.

More specifically, the surface light source device 10 has, as the entire surface light source device 10, a total light transmittance of usually 60% or higher, preferably 70% or higher, and more preferably 80% or higher. The upper limit is ideally 100%; however, usually 90% or lower.

Furthermore, since the concavo-convex structure of the surface light source device 10 is appropriately defined, the surface light source device 10 has, as the entire surface light source device 10, a small haze value which is usually 10% or lower, preferably 5% or lower, and more preferably 1% or lower. The lower limit is ideally zero, but usually 0.1% or higher.

2. Second Embodiment

In the first embodiment, concave portions are provided on the light output surface so that these concave portions constitute a concavo-convex structure including flat surface portions and inclined surface portions. However, for example, convex portions may be provided instead of the concave portions. Such an example will be described hereinbelow with reference to the drawings.

Figure 6:
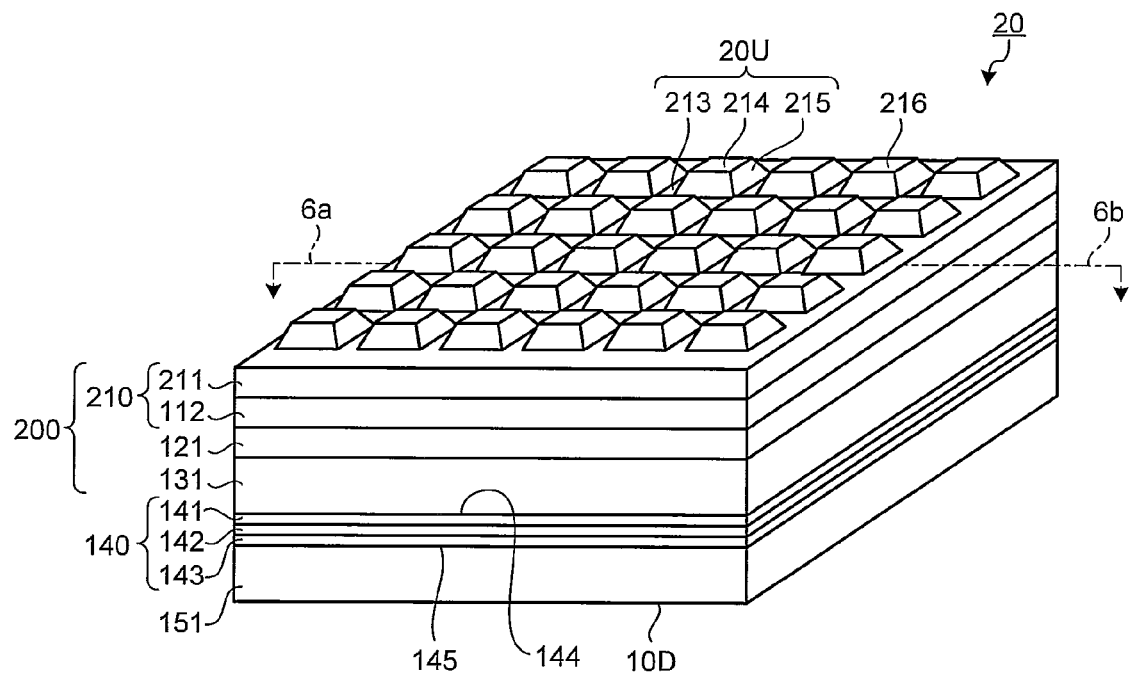
FIG. 6 is a perspective view schematically illustrating a surface light source device according to a second embodiment of the present invention.
Figure 7:
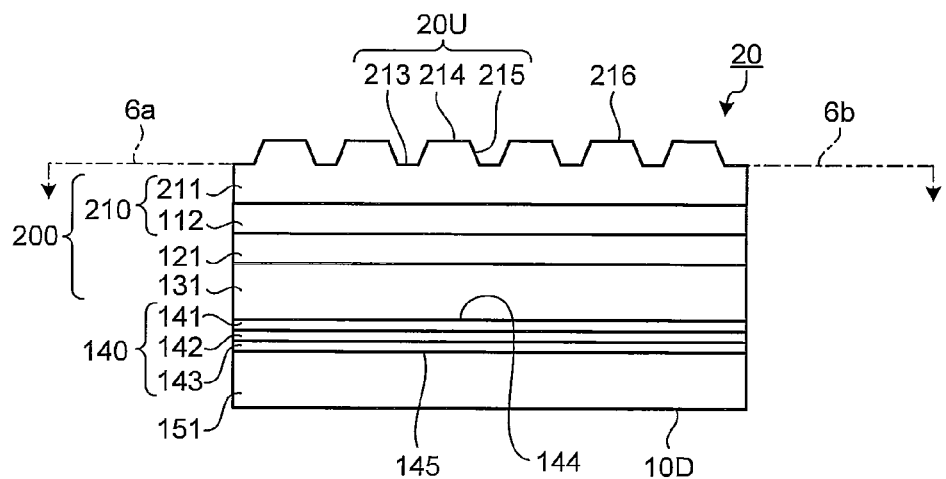
FIG. 7 is a cross-sectional view schematically illustrating the surface light source device according to the second embodiment of the present invention, the cross section thereof cutting the surface light source device shown in FIG. 6 along a plane passing through line 6a-6b and perpendicular to a surface direction of a light output surface.
Figure 8:
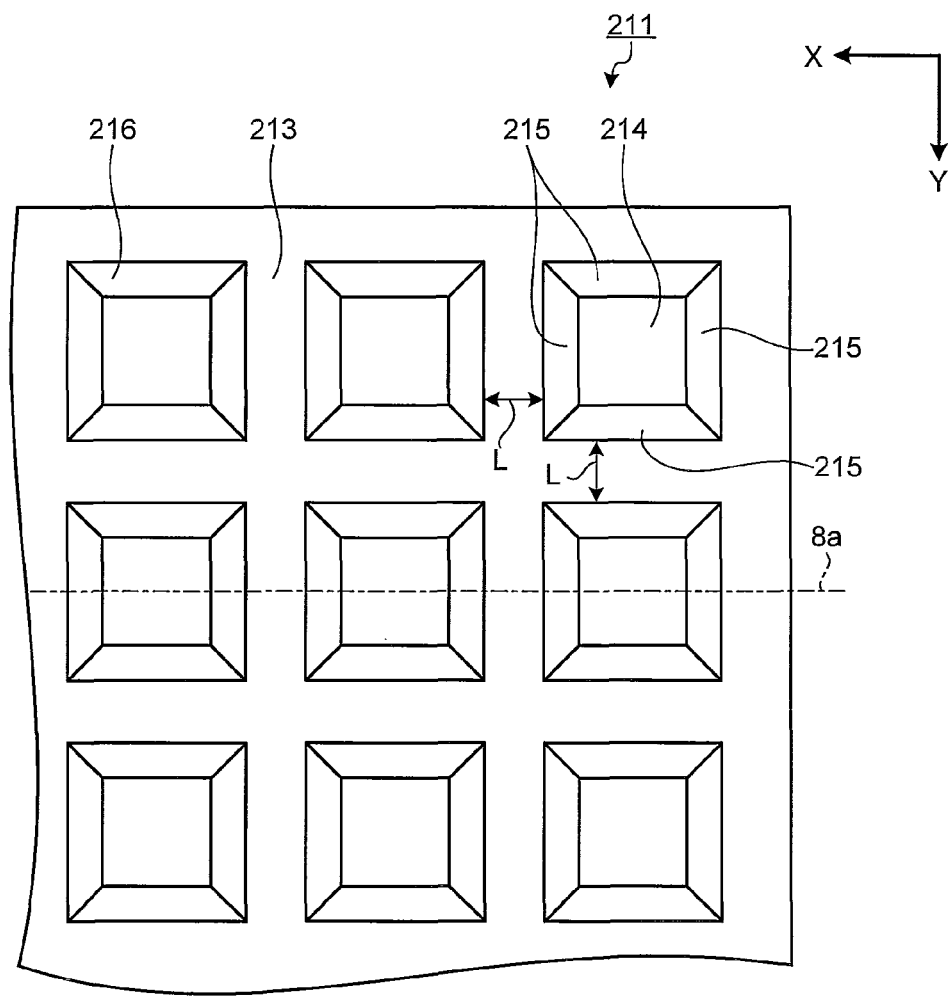
FIG. 8 is an enlarged partial plan view schematically illustrating a part of the light output surface of the surface light source device according to the second embodiment of the present invention when viewed in the thickness direction of the surface light source device.
Figure 9:
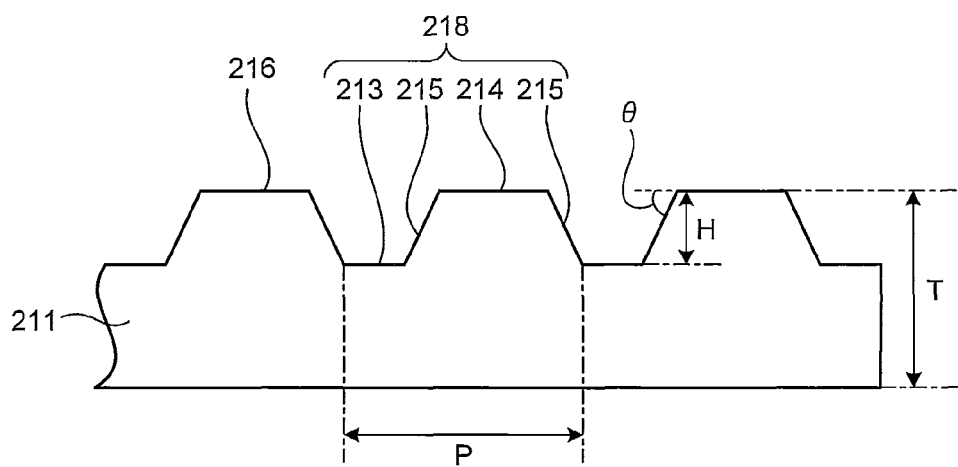
FIG. 9 is a partial cross-sectional view schematically illustrating a cross section of the concavo-convex structure layer according to the second embodiment of the present invention, the cross section thereof being along a plane passing through line 8a shown in FIG. 8 and perpendicular to the light output surface.

FIGS. 6 to 9 are diagrams illustrating a surface light source device according to a second embodiment of the present invention. FIG. 6 is a perspective view schematically illustrating the surface light source device. FIG. 7 is a cross-sectional view schematically illustrating a cross section of the surface light source device shown in FIG. 6, the cross section being along a plane passing through line 6a-6b and perpendicular to a surface direction of a light output surface. FIG. 8 is an enlarged partial plan view schematically illustrating a part of the light output surface of the surface light source device when viewed in the thickness direction of the surface light source device. FIG. 9 is a partial cross-sectional view schematically illustrating a cross section of the concavo-convex structure layer, the cross section being along a plane passing through line 8a shown in FIG. 8 and perpendicular to the light output surface.

As shown in FIGS. 6 to 9, the surface light source device 20 according to the second embodiment of the present invention is the same as the surface light source device 10 of the first embodiment except that a concavo-convex structure layer 211 is provided instead of the concavo-convex structure layer 111. More specifically, the surface light source device 20 according to the second embodiment has the same configuration as that of the first embodiment except for the different shape of a light output surface 20U that is the surface of the concavo-convex structure layer 211 in a multi-layered body 210 constituting a light output surface structure layer 200.

The concavo-convex structure of the light output surface 20U is shaped in such a manner that the recesses and projections of the concavo-convex structure of the light output surface 10U of the first embodiment are reversed. Flat surface portions 213, flat surface portions 214, and inclined surface portions 215 correspond to the flat surface portions 113, the flat surface portions 114, and the inclined surface portions 115 of the first embodiment, respectively. The light output surface 20U thus includes convex portions 216 instead of the concave portions 116. The convex portions 216 have a shape of a square pyramid truncated in parallel to the bottom surface. Each projection portion 216 has a flat surface portion 214 parallel to the light-emitting surface 144 as the top surface, and inclined surface portions 215 tilted relative to the flat surface portion 214 as side surfaces. Moreover, gaps are provided between adjacent concave portions 216. The gaps constitute the flat surface portions 213 parallel to the light-emitting surface 144. In FIG. 9, the reference sign "218" denotes a repetition unit including a flat surface portion 213, an inclined surface portion 215, a flat surface portion 214, and an inclined surface portion 215.

Consequently, in the same manner as in the first embodiment, the projected area of the inclined surface portions 215 of the light output surface 20U of the present embodiment is usually not more than 0.1 times the total area of the flat surface portions 213 and 214. The maximum value of the height difference H between the flat surface portions 213 and 214 of the concavo-convex structure of the light output surface 20U is not more than 12 μm. The inclined surface portions 215 are tilted at an inclination angle θ of greater than or equal to 80° and smaller than 90° relative to the flat surface portions 213 and 214.

Since the surface light source device 20 of the present embodiment is configured as described above, the light emitted from the light-emitting surface 144 of the organic EL element 140 goes out from the light output surface 20U, whereas the light emitted from the light-emitting surface 145 goes out from the light output surface 10D. In this instance, it is possible to extract the light with high efficiency while maintaining the see-through feature. In addition, the same effects as those of the first embodiment can be obtained.

3. Third Embodiment

In the first and second embodiments, the concavo-convex structure is arranged on one of two light-emitting surfaces of the organic EL element. However, the concavo-convex structure may be arranged on both light output surfaces. Such an example will be described hereinbelow with reference to the drawings.

Figure 10:
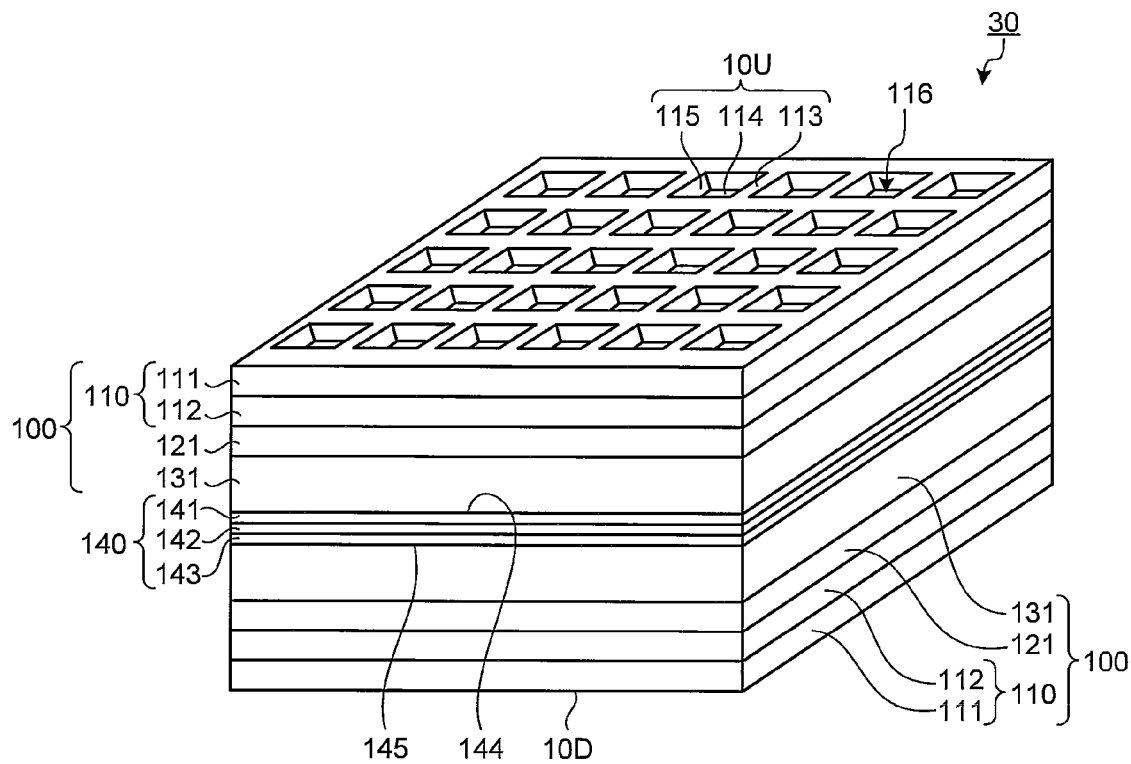
FIG. 10 is a perspective view schematically illustrating a surface light source device according to a third embodiment of the present invention.

FIG. 10 is a perspective view schematically illustrating a surface light source device according to a third embodiment of the present invention. As shown FIG. 10, the surface light source device 30 according to the third embodiment of the present invention is the same as the surface light source device 10 of the first embodiment except that a light output surface structure layer 100 is provided instead of the sealing substrate 151. As a result, the surface light source device 30 includes the light output surface structure layers 100 on both two light-emitting surfaces 144 and 145 of the organic EL element 140. The surface light source device 30 thus has concavo-convex structures on both two light output surfaces 10U and 10D. In the present embodiment, the concavo-convex structure layers provided on two light output surfaces have the same shape. However, the present invention is not necessarily limited thereto, and the concavo-convex structure on one light output surface and the concavo-convex structure on the other light output surface may have different shapes.

Since the surface light source device 30 of the present embodiment is configured as described above, the light emitted from the light-emitting surface 144 of the organic EL element 140 goes out from the light output surface 10U, whereas the light emitted from the light-emitting surface 145 goes out from the light output surface 10D. In this instance, it is possible to extract light with high efficiency while maintaining the see-through feature. In addition, the same effects as those of the first embodiment can be obtained.

4. Fourth Embodiment

In the first to third embodiments, the concave portions, the convex portions, and the inclined surface portions included in the concave portions or convex portions are arranged in two mutually orthogonal directions parallel to the light output surfaces. However, such portions may be arranged in two non-orthogonal directions, in three or more directions, or at random. Such an example will be described hereinbelow with reference to the drawings.

Figure 11:
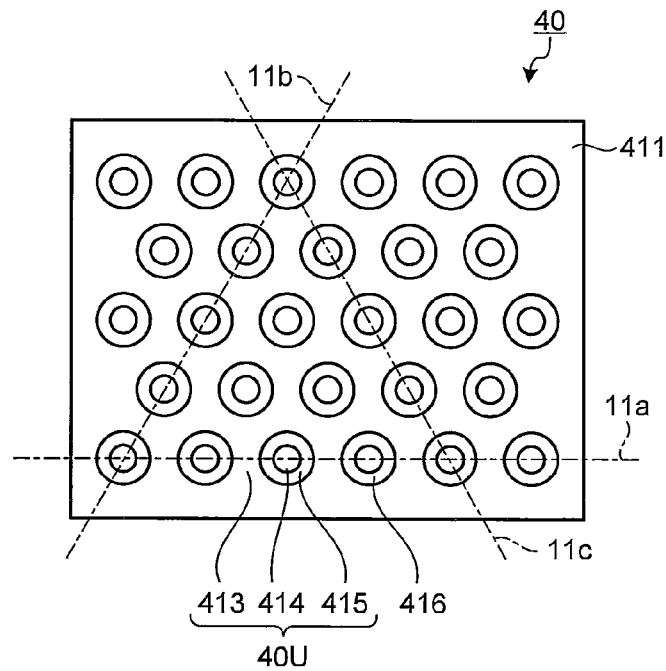
FIG. 11 is a top view schematically illustrating the surface light source device according to a fourth embodiment of the present invention when viewed in the thickness direction of the surface light source device.
Figure 12:
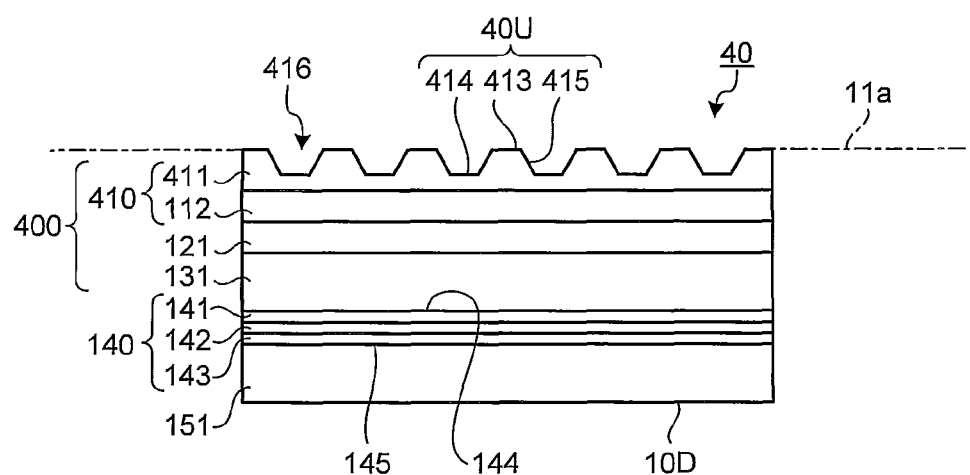
FIG. 12 is a cross-sectional view illustrating the surface light source device according to the fourth embodiment of the present invention, the cross section thereof cutting the surface light source device shown in FIG. 11 along a plane passing through line 11a in FIG. 11 and perpendicular to a light output surface 40U.

FIGS. 11 and 12 are diagrams illustrating a surface light source device according to the fourth embodiment of the present invention. FIG. 11 is a top view schematically illustrating the surface light source device when viewed in the thickness direction of the surface light source device. FIG. 12 is a cross-sectional view illustrating the surface light source device as shown in FIG. 11, the cross section thereof being along a plane passing through line 11a shown in FIG. 11 and perpendicular to a light output surface 40U.

As shown in FIGS. 11 and 12, the surface light source device 40 according to the fourth embodiment of the present invention is the same as the surface light source device 10 of the first embodiment except that a concavo-convex structure layer 411 is provided instead of the concavo-convex structure layer 111. More specifically, the surface light source device 40 according to the fourth embodiment has the same configuration as that of the first embodiment except for the different shape of the light output surface 40U that is the surface of the concavo-convex structure layer 411 in a multi-layered body 410 constituting a light output surface structure layer 400.

The light output surface 40U that is the surface of the concavo-convex structure layer 411 has a plurality of concave portions 416 which are in a shape of a circular cone truncated in parallel to the bottom surface (truncated conical shape). Since the concave portions 416 has the truncated conical shape, the concave portions 416 have a flat surface portion 414 parallel to the light-emitting surface 144 as the bottom surface, and an inclined surface portion 414 tilted relative to the flat surface portion 414 as a side surface. On the light output surface 40U, the concave portions 416 are consecutively arranged in three in-plane directions parallel to lines 11a, 11b, and 11c at regular intervals. In this instance, the lines 11a, 11b, and 11c form angles of 60° with respect to each other. Consequently, gaps are provided between adjacent concave portions 413 along the lines 11a, 11b, and 11c. The gaps constitute flat surface portions 413 parallel to the light-emitting surface 144.

In the same manner as in the first embodiment, the projected area of the inclined surface portions 415 of the light output surface 40U of the present embodiment is usually not more than 0.1 times the total area of the flat surface portions 413 and 414. The maximum value of the height difference between the flat surface portions 413 and 414 of the concavo-convex structure of the light output surface 40U is not more than 12 μm. The inclined surface portions 415 are tilted at an inclination angle θ of greater than or equal to 80° and smaller than 90° relative to the flat surface portions 413 and 414.

Since the surface light source device 40 of the present embodiment is configured as described above, the light emitted from the light-emitting surface 144 of the organic EL element 140 goes out from the light output surface 40U, whereas the light emitted from the light-emitting surface 145 goes out from the light output surface 10D. In this instance, it is possible to extract the light with high efficiency while maintaining the see-through feature. In addition, the same effects as those of the first embodiment can be obtained.

5. Fifth Embodiment

In the first to fourth embodiments, the concave portions or convex portions formed on a common light output surface have a constant size, and therefore the flat surface portions and inclined surface portions that the concavo-convex structure has are respectively formed in a constant size. However, the sizes may be made non-uniform to produce a size variation. If a size variation exceeding a difference that causes the interference of either one or both of the outgoing light going out from the light output surface and the reflected light that is reflected at the light output surface is provided, rainbow unevenness resulting from the interference of one or both of the outgoing light and the reflected light can be favorably suppressed. For example, it is preferable that the height difference between the flat surface portions, which is the depth or height of the concave portions or convex portions, has the aforementioned size variation. The outgoing light that goes out from the light output surface includes not only the light emitted from the organic EL element but also the transmitted light that has entered the surface light source device from the opposite side of the light output surface and then passes through the surface light source device. An example of such a concavo-convex structure will be described hereinbelow with reference to the drawings.

Figure 13:
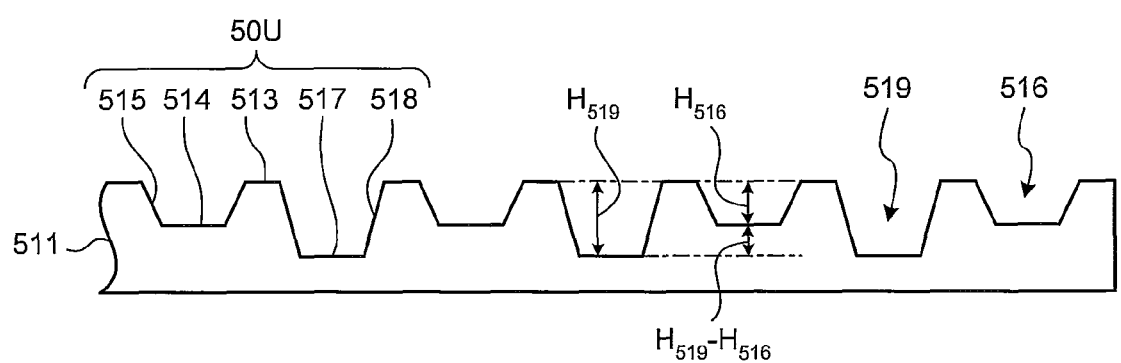
FIG. 13 is a cross-sectional view schematically illustrating a cross section of the concavo-convex structure layer according to a fifth embodiment of the present invention.

FIG. 13 is a cross-sectional view schematically illustrating a cross section of a concavo-convex structure layer according to a fifth embodiment of the present invention. As shown in FIG. 13, a light output surface 50U is the surface of the concavo-convex structure layer 511 according to the fifth embodiment of the present invention. The light output surface 50U includes a plurality of concave portions 516 which have a flat surface portion 514 as the bottom surface and inclined surface portions 515 as side surfaces, and a plurality of concave portions 519 which have a flat surface portion 517 as the bottom surface and inclined surface portions 518 as side surfaces. Gaps are provided between the concave portions 516 and 519. The gaps constitute flat surface portions 513.

In the same manner as in the first embodiment, the projected area of the inclined surface portions 515 and 518 of the output surface 50U of the present embodiment is usually not more than 0.1 times the total area of the flat surface portions 513, 514, and 517. The maximum value of the height difference between the flat surface portions 513, 514, and 517 of the concavo-convex structure of the light output surface 50U is not more than 12 μm. The inclined surface portions 515 and 518 are tilted at an inclination angle of greater than or equal to 80° and smaller than 90° relative to the flat surface portions 513, 514, and 517.

The depth of the concave portion 516 (i.e., the height difference between the flat surface portion 513 and the flat surface portion 514), $H_{516}$, is smaller than the depth of the concave portion 519 (i.e., the height difference between the flat surface portion 513 and the flat surface portion 517), $H_{519}$. In this instance, if a size variation $H_{519}$-$H_{516}$ between the depth $H_{516}$ of the concave portion 516 and the depth $H_{519}$ of the concave portion 519 exceeds the difference that causes the interference of either one or both of the outgoing light and the reflected light, rainbow unevenness resulting from interference can be suppressed. In this instance, the aforementioned size variation $H_{519}$-$H_{516}$ may be a size variation exceeding the difference that causes the interference of the outgoing light. However, since the reflected light tends to have a higher impact on rainbow unevenness than the outgoing light, the size variation $H_{519}$-$H_{516}$ is preferably a size variation exceeding the difference that causes the interference of the reflected light, and more preferably a size variation exceeding the difference that causes the interference of both the outgoing light and the reflected light. More specifically, if there is no such size variation, the light reflected at the flat surface portions 513, 514, and 517 of the upper surface of the concavo-convex structure layer 511 and the light reflected at the lower surface of the concavo-convex structure layer 511 cause interference therebetween to produce rainbow unevenness. In contrast, the provision of the predetermined size variation for the concavo-convex structure on the surface can suppress the interference between the reflected light beams and can suppress rainbow unevenness on the light output surface 10U.

Taking an example of the interference of the outgoing light emitted from the organic EL element 140, the size variation exceeding the difference that causes the interference is, for example, usually not less than 0.62 times, and preferably not less than 1.5 times the center wavelength of the outgoing light. Provision of such a size variation can suppress the occurrence of rainbow unevenness. The upper limit of the size variation is, though not particularly limited to, preferably not more than 60 times the center wavelength of the outgoing light.

The aforementioned numerical range has been confirmed based on the following findings. That is, in an instance wherein a structure layer is designed in such a manner that all the concave portions have the same depth, an error of 170 nm or greater in the depth of the concave portions may cause interference and produce rainbow unevenness. It has been found that, in this instance, occurrence of rainbow unevenness can be suppressed by intentionally providing a size variation twice or more as high as the minimum value of errors that cause such rainbow unevenness. Furthermore, in an instance wherein a structure layer is designed in such a manner that all the concave portions have the same depth, fluctuation with a standard deviation of σ1 nm (≈60 nm) in the depth of the concave portions may cause interference and produce rainbow unevenness. It has been found that, in this instance, occurrence of rainbow unevenness can be suppressed by intentionally providing a size variation of 6×σ1 nm (=360 nm) or more. The aforementioned two findings show that a size variation exceeding the difference that causes the interference of the outgoing light is not less than 0.62 times the center wavelength of the light going out from the surface light source device.

From the same reason, a size variation exceeding the difference that causes the interference of the transmitted light and the reflected light is usually not less than 0.62 times, preferably not less than 1.5 times, and usually not more than 60 times the center wavelength of the transmitted light and the reflected light. However, since the transmitted light and the reflected light are usually natural light and include arbitrary wavelengths, it is difficult to determine the center wavelength of the light reflected. In view of the fact that rainbow unevenness are caused by visible light, the wavelength of 550 nm that is the center wavelength of visible light may be usually employed as the center wavelength of the reflected light for setting the aforementioned size variation.

As in the present embodiment wherein the concavo-convex structure has a size variation, it is possible to extract light with high efficiency while maintaining the see-through feature. In addition, the same effects as those of the first embodiment can be obtained.

The same effects can be obtained even when the aforementioned size variation is provided for a factor other than the height difference of the flat surface portions. For example, rainbow unevenness can be suppressed in the same manner if one or more of a group of factors, such as the height difference of the flat surface portions, the intervals of the concave portions or the convex portions, and the pitch of the repetition structures, have the aforementioned size variation.

6. Sixth Embodiment

The light output surface structure layer according to the present invention is applicable to any surface light source device that includes an organic EL element. The aforementioned light output surface structure layer may thus be provided on a surface light source device that has a symmetrical layer structure about the organic EL element. The light output surface structure layer may also be provided on a surface light source device that has an asymmetrical layer structure about the organic EL element. For example, the third embodiment is an example showing the symmetrical surface light source device in terms of having no layers other than the light output surface structure layers on each of the light-emitting surfaces 144 and 145 of the organic EL element. However, the structure layers may be applied to a surface light source device having an asymmetrical layer structure about the organic EL element. Such an example will be described hereinbelow with reference to the drawings.

Figure 14:
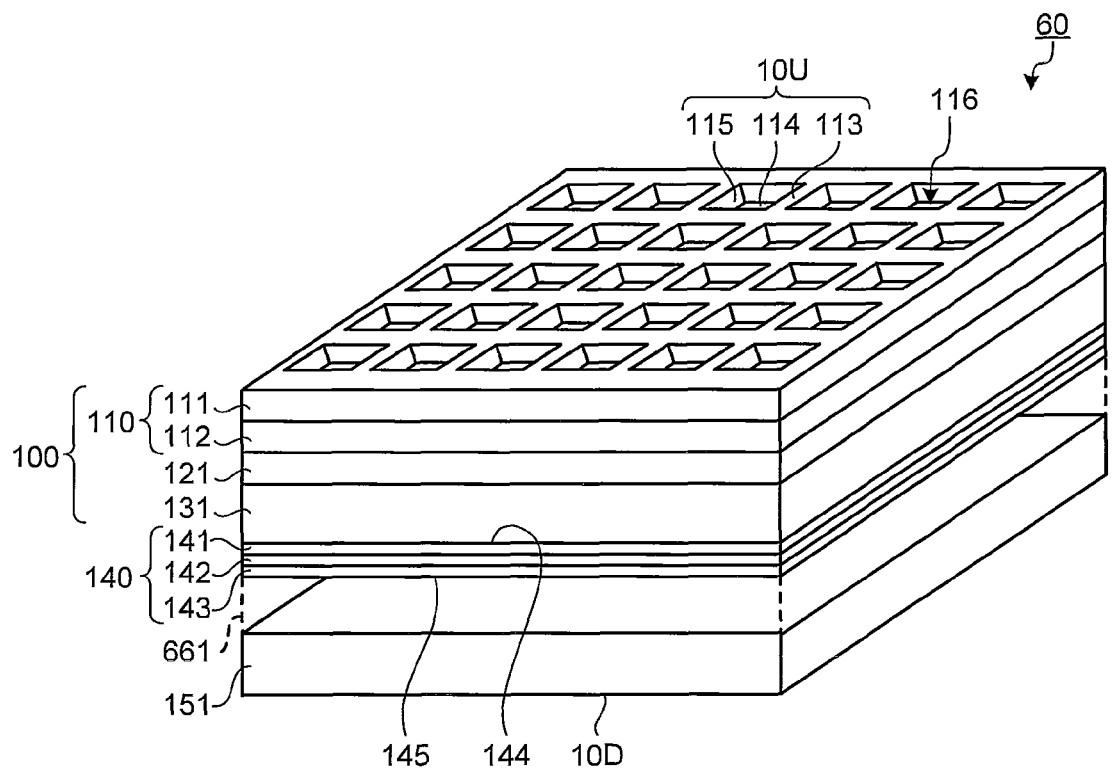
FIG. 14 is a perspective view schematically illustrating a surface light source device according to a sixth embodiment of the present invention.

FIG. 14 is a perspective view schematically illustrating a surface light source device according to a sixth embodiment of the present invention. As shown in FIG. 14, the surface light source device 60 according to the sixth embodiment of the present invention is the same as the surface light source device 10 according to the first embodiment except that an inert gas layer 661 is provided between the second transparent electrode layer 143 of the organic EL element 140 and the sealing substrate 151.

The inert gas layer 661 is a layer for protecting the organic EL element 140 from being deteriorated by oxygen and moisture infiltration from outside, and is filled with an inert gas such as nitrogen gas. The side surfaces of the surface light source device 60 are usually sealed by a non-shown sealing member, so that the gas in the inert gas layer 661 will not leak out.

The surface light source device 60 has a layer structure asymmetrical about the organic EL element 140 in terms of having the inert gas layer 661 arranged only on one side of the light-emitting surface 145 of the organic EL element 140. With such a surface light source device 60, it is also possible to extract light with high efficiency while maintain the see-through feature. The same effects as those of the first embodiment can also be obtained.

7. Others

While the surface light source device of the present invention has been described with referring to the embodiments, the present invention may be practiced with further modifications.

For example, in the aforementioned embodiments, the light output surface structure layer(s) is/are provided directly in contact with the light-emitting surface(s). However, the light source surface structure layer(s) may be provided on the light-emitting surface(s) via another optional layer. Examples of the optional layers may include a gas barrier layer for protecting the organic EL element from outside air and moisture, and an ultraviolet cut layer for blocking ultraviolet rays.

Moreover, for example, the aforementioned embodiments shown are those having the light output surface structure layers that consists of a concavo-convex structure layer, a substrate film layer, an adhesive layer, and a support substrate. However, the light output surface structure layer may consist of layers that are fewer than these, or may otherwise include optional layers in addition to these layers. For example, the concavo-convex structure layer may also have a coating layer on a surface thereof, so that the coating layer defines the concavo-convex structure of the light output surface.

Moreover, for example, the positions, directions, shapes, and numbers of the flat surface portions and the inclined surface portions, and combinations thereof are not limited to those of the embodiments and may be modified.

Figure 15:
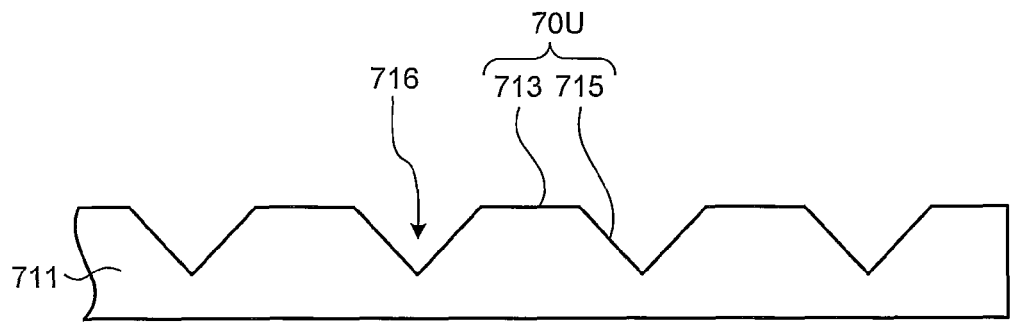
FIG. 15 is a cross-sectional view schematically illustrating a cross section of a concavo-convex structure layer according to another embodiment of the present invention.

For example, the flat surface portions may be provided at a single even height as shown in FIG. 15, not at two height positions as in the aforementioned embodiments. FIG. 15 is a cross-sectional view schematically illustrating a cross section of the concavo-convex structure layer according to another embodiment of the present invention. In the concavo-convex structure layer 711 shown in FIG. 15, inclined surface portions 715 are provided as the side surfaces of pyramidal concave portions 716, and flat surface portions 713 are provided at an even height position in the gaps between adjacent concave portions 716. When the flat surface portions are thus provided at a single even height position, it is also possible to extract light with high efficiency from the light output surface 70U including the flat surface portions 713 and the inclined surface portions 715 and provide a favorable see-through feature if the projected area of the inclined surface portions 715 falls within a predetermined range relative to the area of the flat surface portions 713.

Figure 16:
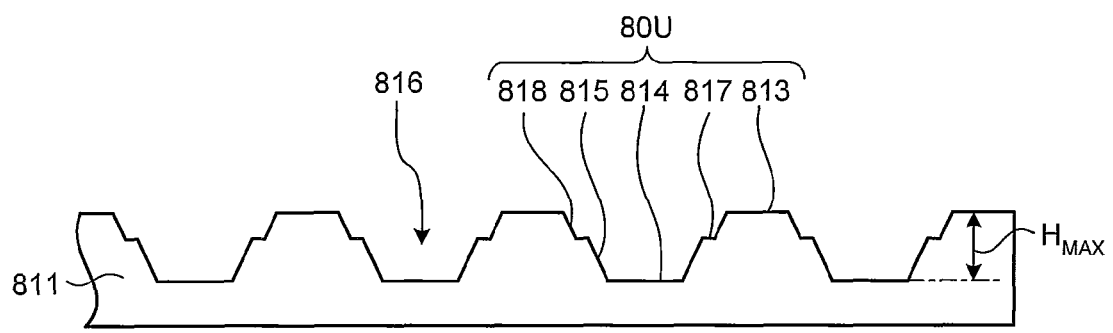
FIG. 16 is a cross-sectional view schematically illustrating a cross section of a concavo-convex structure layer according to still another embodiment of the present invention.

Furthermore, for example, the flat surface portions may be arranged to three or more height positions as shown in FIG. 16. FIG. 16 is a cross-sectional view schematically illustrating a cross section of a concavo-convex structure layer according to another embodiment of the present invention. In the concavo-convex structure layer 811 shown in FIG. 16, concave portions 816 include flat surface portions 814 and 817 as well as inclined surface portions 815 and 818. The inclined surface portions 815 are provided around the flat surface portion 814 as the bottom surface. The flat surface portions 817 are provided around the inclined surface portions 815. The inclined surface portions 818 are provided around the flat surface portions 817. Flat surface portions 813 are provided in the gaps between adjacent concave portions 816. When the height positions of the flat surface portions are thus leveled at three or more multiple stages, it is also possible to extract light with high efficiency from the light output surface 80U including the flat surface portions 813, 814, and 817, and the inclined surface portions 815 and 818 and provide a favorable see-through feature if the projected area of the inclined surface portions 815 and 818 falls within a predetermined range relative to the total area of the flat surface portions 813, 814, and 817. When the height positions of the flat surface portions are leveled at three or more multiple stages, the maximum value of the height difference between the flat surface portions in the thickness direction is the size shown by the reference sign $H_{MAX}$ in FIG. 16.

Figure 17:
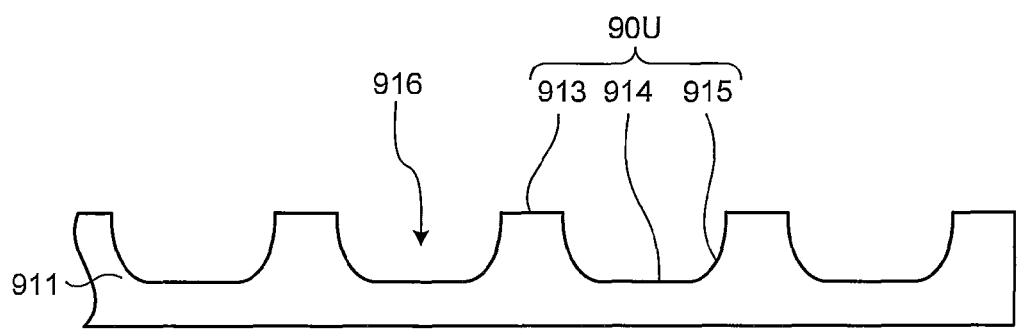
FIG. 17 is a cross-sectional view schematically illustrating a cross section of a structure layer according to still another embodiment of the present invention.

Other than the aforementioned embodiments wherein the inclined surface portions are configured as uncurved surfaces, the inclined surface portions may be configured as curved surfaces as shown in FIG. 17. FIG. 17 is a cross-sectional view schematically illustrating a cross section of the structure layer according to another embodiment of the present invention. In the concavo-convex structure layer 911 shown in FIG. 17, a flat surface portion 914 is provided as the bottom surface of a concave portion 916. Inclined surface portions 915 of curved shape whose inclination angle increases or decreases as the distance from the flat surface portion 914 increases are arranged around the flat surface portion 914. Flat surface portions 913 are arranged around the inclined surface portions 915. When the inclined surface portions are configured as curved surfaces, it is also possible to extract light with high efficiency from the light output surface 90U including the flat surface portions 913 and 914 and the inclined surface portions 915 and provide a favorable see-through feature if the projected area of the inclined surface portions 915 falls within a predetermined range relative to the total area of the flat surface portions 913 and 914.

Consequently, the concave portions and convex portions formed on the light output surface may have a variety of shapes, such as a prismoidal shape, a truncated conical shape, the shape of a part of a spherical surface, and a combination thereof. The bottom surface of the prismoidal shape may be a triangular shape, a pentagonal shape, a hexagonal shape, or a rectangular shape other than the square shape.

The aforementioned embodiments shown are those wherein the concave portions or convex portions of the identical shape are distributed over the entire light output surface. However, the light output surface may include a mixture of concave portions or convex portions having different shapes, or a mixture of concave portions and convex portions. For example, concave portions or convex portions having different sizes may coexist. Concave portions or convex portions having prismoidal shape and truncated conical shape may coexist. Inclined surface portions having different inclination angles may coexist.

The aforementioned embodiments shown are those wherein the widths of the concave portions or convex portions and the intervals between adjacent concave portions or between adjacent convex portions are constant. However, concave portions and convex portions having small widths and large widths may coexist. Portions having wide intervals and portions having narrow intervals between adjacent concave portions or between adjacent convex portions may coexist.

8. Applications

The surface light source device of the present invention may be used for applications such as a lighting apparatus and a backlight unit.

The lighting apparatus includes the surface light source device of the present invention as a light source, and if necessary, further includes an optional component such as a member for holding the light source and a circuit for supplying electrical power.

The backlight unit includes the surface light source device of the present invention as a light source, and if necessary, further includes an optional component such as an enclosure, a circuit for supplying electrical power, and a diffusion plate, diffusion sheet, and prism sheet for making the output light more uniform. Possible applications of the backlight unit may include a backlight of a display device that displays an image by controlling pixels, such as a liquid crystal display, and a backlight of a display device that displays a fixed image such as a signboard.

EXAMPLES

The present invention will be specifically explained referring to Examples. However, the present invention is not limited to Examples shown below, but may be arbitrary modified without departing from the scope of the claims and equivalents thereof.

Examples and Comparative Examples where Flat Surfaces have Non-Uniform Height Differences Example 1

Manufacture of Multi-Layered Body

Figure 18:
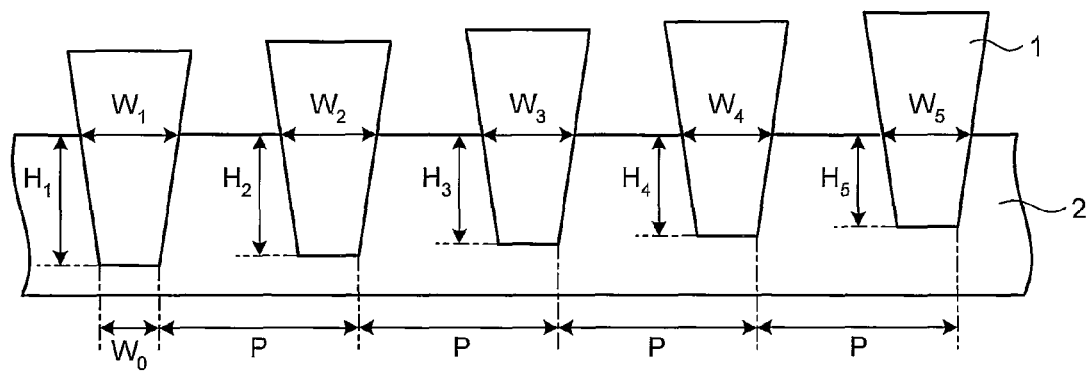
FIG. 18 is a cross-sectional view schematically illustrating manufacture of a metal mold used in Example 1.

A UV curable resin (refractive index of 1.54) composed mainly of urethane acrylate was applied onto a roll of film substrate (trade name "ZEONOR film," from ZEON Corporation, an alicyclic structure-containing polymer resin film, thickness of 100 μm, refractive index of 1.53) to form a coating layer. A metal mold was pressed against the coating layer. Keeping this state, irradiation with ultraviolet rays of 1.5 mJ/cm² was performed to cure the coating layer, whereby a concavo-convex structure layer (thickness of 12 μm) having a concavo-convex structure was formed. The metal mold for forming the concavo-convex structure was obtained by cutting one surface of a metal plate 2 for producing the mold. The cutting was performed by using a cutting tool 1 having an apex angle of 15° and a tip end width of 5 μm for creating a repetition unit shown in FIG. 18 in one in-plane direction and then in another direction orthogonal to that direction. The cutting was performed at a constant cutting pitch P. The depths of the grooves formed by the cutting were changed in five levels $H_1$ to $H_5$. With the created five grooves as a repetition unit, cutting was repeated. In the present example, the cutting pitch P was 35 μm. The depths $H_1$ to $H_5$ of the grooves included in the repetition unit were such that $H_1$ was 6.4 μm, $H_2$ was 6.7 μm, $H_3$ was 7 μm, $H_4$ was 7.3 μm, and $H_5$ was 7.6 μm. The widths $W_1$ to $W_5$ of the five grooves formed thus were such that $W_1$ was 6.69 μm, $W_2$ was 6.76 μm, $W_3$ was 6.84 μm, $W_4$ was 6.92 μm, and $W_5$ was 7.00 μm.

Figure 19:
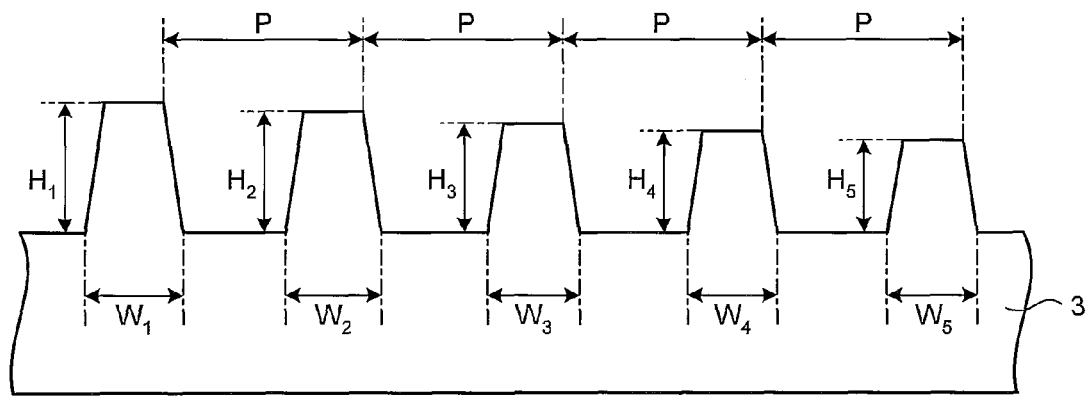
FIG. 19 is a cross-sectional view schematically illustrating a cross section of the concavo-convex structure layer in Example 1 cut along a plane perpendicular to the cutting direction.

FIG. 19 is a diagram schematically illustrating a cross section of the concavo-convex structure layer obtained in Example 1, taken along a plane orthogonal to the cutting direction. As shown in FIG. 19, a concavo-convex structure including a number of rectangular prismoidal concave portions corresponding to the grooves formed on the metal mold was formed on the surface of the resulting concavo-convex structure layer 3. A plurality of flat surfaces having different height positions and pitches were provided around the concave portions. On the surface of the concavo-convex structure layer 3 where the concavo-convex structure was formed, the inclined surface portions had a mean inclination angle of 82.5° relative to the flat surface portions. The ratio of the projected area of the inclined surface portions relative to the total area (entire area) of the flat surface portions was 0.1. The maximum height difference between the flat surface portions was 7.6 μm. The rectangular prismoidal concave portions had a mean base edge length of 30 μm and a mean depth of 7 μm.

(Manufacture of Transparent Organic EL Element)

On a glass substrate having a transparent electrode layer formed on the main surface, a hole injection layer, a hole transport layer, a light-emitting layer, a hole blocking layer, a charge generation layer, a metal oxide layer, and a cathode were formed in this order. The materials for forming respective layers and the thicknesses thereof were as follows.

Transparent electrode layer: ITO of 300 nm
Hole injection layer: trioxide molybdenum ($MoO_3$) of 5 nm
Hole transport layer: NS-21 (from Nippon Steel Chemical Co., Ltd.), $MoO_3$ of 20 nm, and NS21 of 5 nm; being 25 nm in total
Light-emitting layer: NS21 and EY52 (from e-Ray Optoelectronics Technology (hereinafter referred to as e-Ray)) of 20 nm, and EB43 and EB52 (both from e-Ray) of 30 nm; being 50 nm in total
Hole blocking layer: bis(2-methyl-8-quinolinolate) (p-phenylphenolate) aluminum (BAlq) of 5 nm
Charge generation layer: Liq and DPB of 35 nm, aluminum of 1.5 nm, and NS21 and $MoO_3$ of 10 nm; being 37.5 nm in total
Metal oxide layer: $MoO_3$ of 5 nm
Cathode: ITO of 100 nm The layers from the hole injection layer to the metal oxide layer were formed by placing in a vacuum vapor-deposition system the glass substrate having the transparent electrode layer formed thereon, and then the materials for the layers from the hole transportation layer to the metal oxide layer were sequentially vapor-deposited by resistance heating. The pressure in the system was set to $5 \times 10^{-3}$ Pa and evaporation speed was set to 0.1 to 0.2 nm/s. Subsequently, the ITO of the cathode layer was deposited by facing target sputtering. This was sealed using a UV curable resin with another glass plate, to thereby obtain a transparent organic EL element 1. Electricity was applied to the resulting transparent organic EL element 1 for driving the element. As a result, good white light emission was obtained. The element had an excellent transparency in both the front and oblique directions. As employed herein, the front direction refers to a direction parallel to the normal direction of the light-emitting surface. The oblique direction refers to a direction tilted at 45° relative to the light-emitting surface.

(Manufacture of Surface Light Source Device 1)

The film substrate with the concavo-convex structure layer formed thereon was affixed to the resulting transparent organic EL element 1 with an adhesive layer (acrylic-based resin, refractive index of 1.49, from Nitto Denko Corporation, CS9621), to thereby obtain a surface light source device 1 having a layer structure of (the transparent organic EL element 1)—(the adhesive layer)—(the film substrate)—(the concavo-convex structure layer). Electricity was applied to the resulting surface light source device 1 to emit light, and transparency of the surface light source device 1 was visually evaluated. The surface light source device 1 had an excellent transparency in the front direction and in the oblique direction.

Example 2

A metal mold, a concavo-convex structure layer (thickness of 7.5 μm), and a surface light source device 2 were produced in the same manner as in Example 1 except for the following. The cutting tool was changed to one having an apex angle of 20.0° and a tip end width $W_0$ of 10 μm. The widths $W_1$ to $W_5$ of the grooves formed on the metal mold were set so that $W_1$ was 11.38 μm, $W_2$ was 11.60 μm, $W_3$ was 11.82 μm, $W_4$ was 12.04 μm, and $W_5$ was 12.26 μm. The heights $H_1$ to $H_5$ of the grooves were set so that $H_1$ was 1.9 μm, $H_2$ was 2.2 μm, $H_3$ was 2.5 μm, $H_4$ was 2.8 μm, and $H_5$ was 3.1 μm. The cutting pitch P was set to 40 μm.

On the surface of the produced concavo-convex structure layer where the concavo-convex structure was formed, the inclined surface portions had a mean inclination angle of 70° relative to the flat surface portions. The ratio of the projected area of the inclined surface portions relative to the total area of the flat surface portions was 0.07. The maximum height difference between the flat surface portions was 3.1 μm. The rectangular prismoidal concave portions had a mean base edge length of 30 μm and a mean depth of 2.5 μm.

Electricity was applied to the resulting surface light source device 2 to emit light, and transparency of the surface light source device 2 was visually evaluated. The surface light source device 2 had an excellent transparency in the front direction and in the oblique direction.

Example 3

A concavo-convex structure layer (thickness of 25 μm) and a surface light source device 3 were produced in the same manner as in Example 1 except for the following. The cutting tool was changed to one having an apex angle of 5.0° and a tip end width $W_0$ of 10 μm. The widths $W_1$ to $W_5$ of the grooves formed on the metal mold were set so that $W_1$ was 11.69 μm, $W_2$ was 11.72 μm, $W_3$ was 11.75 μm, $W_4$ was 11.77 μm, and $W_5$ was 11.80 μm. The heights $H_1$ to $H_5$ of the grooves were set so that $H_1$ was 19.4 μm, $H_2$ was 19.7 μm, $H_3$ was 20.0 μm, $H_4$ was 20.3 μm, and $H_5$ was 20.6 μm. The cutting pitch P was set to 130 μm.

On the surface of the produced concavo-convex structure layer where the concavo-convex structure was formed, the inclined surface portions had a mean inclination angle of 87.5° relative to the flat surface portions. The ratio of the projected area of the inclined surface portions relative to the total area of the flat surface portions was 0.03. The maximum height difference between the flat surface portions was 20.6 μm. The rectangular prismoidal concave portions had a mean base edge length of 120 μm and a mean depth of 20 μm.

Electricity was applied to the resulting surface light source device 3 to emit light, and transparency of the surface light source device 3 was visually evaluated. The surface light source device 3 had an excellent transparency in the front direction and in the oblique direction.

Example 4

A metal mold A was produced in the same manner as in Example 1 except for the following. The cutting tool was changed to one having an apex angle of 40.0° and a tip end width $W_0$ of 59.08 μm. The widths $W_1$ to $W_5$ of the grooves formed on the metal mold were set so that $W_1$ was 69.56 μm, $W_2$ was 69.78 μm, $W_3$ was 70.00 μm, $W_4$ was 70.22 μm, and $W_5$ was 70.44 μm. The heights $H_1$ to $H_5$ of the grooves were set so that $H_1$ was 14.44 μm, $H_2$ was 14.7 μm, $H_3$ was 15.0 μm, $H_4$ was 15.3 μm, and $H_5$ was 15.6 μm. The cutting pitch P was set to 210 μm. Then nickel electrocasting was performed on the metal mold A to produce a metal mold B having a concavo-convex structure of reversed configuration on its surface. A surface light source device 4 was produced in the same manner as in Example 1 except that the aforementioned metal mold B was used as the metal mold to form a concavo-convex structure layer (thickness of 20 μm).

On the surface of the produced concavo-convex structure layer where the concavo-convex structure was formed, the inclined surface portions had a mean inclination angle of 70.0° relative to the flat surface portions. The ratio of the projected area of the inclined surface portions relative to the total area of the flat surface portions was 0.04. The maximum height difference between the flat surface portions was 15.6 μm. The rectangular prismoidal concave portions had a mean base edge length of 70 μm and a mean depth of 15 μm.

Electricity was applied to the resulting surface light source device 4 to emit light, and transparency of the surface light source device 4 was visually evaluated. The surface light source device 4 had an excellent transparency in the front direction and in the oblique direction.

Comparative Example 2

A surface light source device 5 was produced in the same manner as in Example 1 except for the following. The cutting tool was changed to one having an apex angle of 15.0° and a tip end width $W_0$ of 2.5 μm. The widths $W_1$ to $W_5$ of the grooves formed on the metal mold were set so that $W_1$ was 4.98 μm, $W_2$ was 5.05 μm, $W_3$ was 5.13 μm, $W_4$ was 5.21 μm, and $W_5$ was 5.29 μm. The heights $H_1$ to $H_5$ of the grooves were set so that $H_1$ was 9.4 μm, $H_2$ was 9.7 μm, $H_3$ was 10.0 μm, $H_4$ was 10.3 μm, and $H_5$ was 10.6 μm. The cutting pitch P was set to 37.5 μm.

On the surface of the concavo-convex structure layer (15 μm in thickness) where the concavo-convex structure was formed, the ratio of the projected area of the inclined surface portions relative to the total area of the flat surface portions was 0.14. The maximum height difference between the flat surface portions was 10.6 μm. The rectangular prismoidal concave portions had a mean base edge length of 35 μm and a mean depth of 10 μm.

Electricity was applied to the resulting surface light source device 5 to emit light, and transparency of the surface light source device 5 was visually evaluated. The surface light source device 5 had a poor transparency in the front direction and in the oblique direction.

Comparative Example 3

A surface light source device 6 was produced in the same manner as in Example 1 except for the following. The cutting tool was changed to one having an apex angle of 40.0° and a tip end width $W_0$ of 5.0 μm. The widths $W_1$ to $W_5$ of the grooves formed on the metal mold were set so that $W_1$ was 8.2 μm, $W_2$ was 8.42 μm, $W_3$ was 8.64 μm, $W_4$ was 8.86 μm, and $W_5$ was 9.08 μm. The heights $H_1$ to $H_5$ of the grooves were set so that $H_1$ was 4.4 μm, $H_2$ was 4.7 μm, $H_3$ was 5.0 μm, $H_4$ was 5.3 μm, and $H_5$ was 5.6 μm. The cutting pitch P was set to 35.0 μm.

On the surface of the concavo-convex structure layer (10 μm in thickness) where the concavo-convex structure was formed, the ratio of the projected area of the inclined surface portions relative to the total area of the flat surface portions was 0.2. The maximum height difference between the flat surface portions was 5.6 μm. The rectangular prismoidal concave portions had a mean base edge length of 30 μm and a mean depth of 5 μm.

Electricity was applied to the resulting surface light source device 6 to emit light, and transparency of the resulting surface light source device 6 was visually evaluated. The surface light source device 6 had a poor transparency in the front direction and in the oblique direction.

Comparative Example 4

A surface light source device 7 was produced in the same manner as in Example 1 except for the following. The cutting tool was changed to one having an apex angle of 15.0° and a tip end width $W_0$ of 10.0 μm. The widths $W_1$ to $W_5$ of the grooves formed on the metal mold were set so that $W_1$ was 15.11 μm, $W_2$ was 15.19 μm, $W_3$ was 15.27 μm, $W_4$ was 15.35 μm, and $W_5$ was 15.42 μm. The heights $H_1$ to $H_5$ of the grooves were set so that $H_1$ was 19.4 μm, $H_2$ was 19.7 μm, $H_3$ was 20.0 μm, $H_4$ was 20.3 μm, and $H_5$ was 20.6 μm. The cutting pitch P was set to 80.0 μm.

On the surface of the concavo-convex structure layer (25 μm in thickness) where the concavo-convex structure was formed, the ratio of the projected area of the inclined surface portions relative to the total area of the flat surface portions was 0.22. The maximum height difference between the flat surface portions was 20.6 μm. The rectangular prismoidal concave portions had a mean base edge length of 70 μm and a mean depth of 20 μm.

Electricity was applied to the resulting surface light source device 7 to emit light, and transparency of the surface light source device 7 was visually evaluated. The surface light source device 7 had a poor transparency in the front direction and in the oblique direction.

Comparative Example 5

A surface light source device 8 was produced in the same manner as in Example 1 except for the following. The cutting tool was changed to one having an apex angle of 40.0° and a tip end width $W_0$ of 20.0 μm. The widths $W_1$ to $W_5$ of the grooves formed on the metal mold were set so that $W_1$ was 34.12 μm, $W_2$ was 34.34 μm, $W_3$ was 34.56 μm, $W_4$ was 34.78 μm, and $W_5$ was 35.00 μm. The heights $H_1$ to $H_5$ of the grooves were set so that $H_1$ was 19.4 μm, $H_2$ was 19.7 μm, $H_3$ was 20.0 μm, $H_4$ was 20.3 μm, and $H_5$ was 20.6 μm. The cutting pitch P was set to 80.0 μm.

On the surface of the concavo-convex structure layer (25 μm in thickness) where the concavo-convex structure was formed, the ratio of the projected area of the inclined surface portions relative to the total area of the flat surface portions was 0.32. The maximum height difference between the flat surface portions was 20.6 μm. The rectangular prismoidal concave portions had a mean base edge length of 60 μm and a mean depth of 20 μm.

Electricity was applied to the resulting surface light source device 8 to emit light, and transparency of the surface light source device 8 was visually evaluated. The surface light source device 8 had a poor transparency in the front direction and in the oblique direction.

[Evaluations]
(Light Extraction Amount)

With the transparent organic EL element 1 obtained in Example 1 and the surface light source devices 1 to 8 obtained in Examples 1 to 4 and Comparative Examples 2 to 5, the intensity of light coming out of both sides was calculated by optical simulation using a program (program name: Light Tools, from Optical Research Associates), assuming that the light-emitting layer had a luminous intensity of 1 lm. The resulting values are shown in Table 1. In Table 1, the numerical value in the column "Adhered surface" represents the amount of light extracted through the light output surface having a concavo-convex structure where the concavo-convex structure layer is formed. The numerical value in the column "Back surface" show the amount of light extracted through the glass surface with no concavo-convex structure layer. The transparent organic EL element 1 is regarded as Comparative Example 1. In Comparative Example 1, the numerical value in the column "Adhered surface" and the numerical value in the column "Back surface" both represent the amount of light extracted through a glass surface with no concavo-convex structure layer.

(Transparency)

The transparent organic EL element 1 and the surface light source devices 1 to 8 in a turned-off state were placed at 50 cm in front of a display surface on which characters of 5 mm×5 mm in size were arrayed. The characters were observed through the transparent organic EL element 1 and the surface light source devices 1 to 8 in the front direction and the oblique direction. The instances wherein characters were clearly observed without smearing and distortion were classified as "Excellent". The instances wherein characters were readable but with smearing and distortion were classified as "Good". The instance wherein characters were not clearly readable with a lot of smearing and distortion were classified as "Bad". The results are shown in Table 1.

(Rainbow Unevenness)

The surface light source devices obtained in Examples 1 to 4 and Comparative Examples 2 to 5 were visually observed to examine existence of rainbow unevenness. Examples 1 to 4 and Comparative examples 2 to 5 were all configured so that their concavo-convex structure had non-uniform height differences within a predetermined range. Therefore, almost no rainbow unevenness based on the interference of light reflected at the surface and backside of the concavo-convex structure layer were observed, and the surface light source devices were found to be excellent.

TABLE 1

[Results of Examples 1-4 and Comparative Examples 1-5]

| | Projected area of inclined surface/area of flat surface portions | Height difference of flat surface portions (μm) | Mean inclination angle of inclined surface(●) | Extraction amount (lm) | | | |
|---|---|---|---|---|---|---|---|
| | | | | Adhered surface | Back surface | Total | Transparency |
| Ex. 1 | 0.1 | 7.6 | 82.5 | 0.67 | 0.31 | 0.98 | Excellent |
| Ex. 2 | 0.07 | 3.1 | 70 | 0.55 | 0.43 | 0.98 | Good |
| Ex. 3 | 0.03 | 20.6 | 87.5 | 0.6 | 0.32 | 0.92 | Good |
| Ex. 4 | 0.04 | 15.6 | 70 | 0.51 | 0.43 | 0.94 | Good |
| Comp. Ex. 1 | | No film | | 0.22 | 0.22 | 0.44 | Good |
| Comp. Ex. 2 | 0.14 | 10.6 | 82.5 | 0.67 | 0.31 | 0.99 | Bad |
| Comp. Ex. 3 | 0.2 | 5.6 | 70 | 0.6 | 0.39 | 0.99 | Bad |
| Comp. Ex. 4 | 0.22 | 20.6 | 82.5 | 0.57 | 0.42 | 0.99 | Bad |
| Comp. Ex. 5 | 0.32 | 20.6 | 70 | 0.56 | 0.43 | 0.99 | Bad |

Examples and Comparative Examples where Flat Surfaces have Uniform Height Differences Example 5

A surface light source device 9 was produced in the same manner as in Example 1 except that the concavo-convex structure layer was formed by using a metal mold on which square prismoidal convex portions having a base edge of 30 μm, a height of 5 μm, and a mean side surface inclination angle of 80° relative to the bottom surface were arranged at a pitch of 35 μm. In this Example, a structure having flat surface portions between adjacent convex portions was formed on the surface of the metal mold. The flat surface portions had uniform height positions. The state wherein the flat surface portions have uniform height positions herein means that the maximum height difference between the flat surface portions is smaller than 0.1 μm. On the surface of the concavo-convex structure layer of the resulting surface light source device 9 where the concavo-convex structure layer (10 μm in thickness) was formed, the ratio of the projected area of the inclined surface portions relative to the total area of the flat surface portions was 0.09. The maximum height difference between the flat surface portions was 5.1 μm. The rectangular prismoidal concave portions had a mean base edge length of 30 μm and a mean depth of 5 μm.

Electricity was applied to the resulting surface light source device 9 to emit light, and transparency of the surface light source device 9 was visually evaluated. The surface light source device 9 has extremely superior transparency in the front direction and in the oblique direction.

Example 6

A surface light source device 10 was produced in the same manner as in Example 1 except that the concavo-convex structure layer was formed by using a metal mold on which square prismoidal convex portions having a base edge of 90 μm, a height of 15 μm, and a mean side surface inclination angle of 87.5° relative to the bottom surface were arranged at a pitch of 97.5 μm. In this Example, a structure having flat surface portions between adjacent convex portions was formed on the surface of the metal mold. The flat surface portions had uniform height positions.

On the surface of the concavo-convex structure layer (20 μm in thickness) where the concavo-convex structure was formed, the ratio of the projected area of the inclined surface portions relative to the total area of the flat surface portions was 0.03. The maximum height difference between the flat surface portions was 15.1 μm. The rectangular prismoidal concave portions had a mean base edge length of 90 μm and a mean depth of 15 μm.

Electricity was applied to the resulting surface light source device 10 to emit light, and transparency of the surface light source device 10 was visually evaluated. The surface light source device 10 had an excellent transparency in the front direction and in the oblique direction.

Example 7

A surface light source device 11 was produced in the same manner as in Example 1 except that the concavo-convex structure layer was formed by using a metal mold on which square prismoidal convex portions having a base edge of 70 μm, a height of 10 μm, and a mean side surface inclination angle of 87.5° relative to the bottom surface were arranged at a pitch of 140 μm. In this Example, a structure having flat surface portions between adjacent convex portions was formed on the surface of the metal mold. The flat surface portions had uniform height positions.

On the surface of the concavo-convex structure layer (15 μm in thickness) where the concavo-convex structure was formed, the ratio of the projected area of the inclined surface portions relative to the total area of the flat surface portions was 0.08. The maximum height difference between the flat surface portions was 10.1 μm. The rectangular prismoidal concave portions had a mean base edge length of 70 μm and a mean depth of 10 μm.

Electricity was applied to the resulting surface light source device 11 to emit light, and transparency of the surface light source device 11 was visually evaluated. The surface light source device 11 had an excellent transparency in the front direction and in the oblique direction.

Example 8

A surface light source device 12 was produced in the same manner as in Example 1 except that the concavo-convex structure layer was formed by using a metal mold on which square prismoidal convex portions having a base edge of 70 μm, a height of 15 μm, and a mean side surface inclination angle of 70° relative to the bottom surface were arranged at a pitch of 210 μm. In this Example, a structure having flat surface portions between adjacent convex portions was formed on the surface of the metal mold. The flat surface portions had uniform height positions.

On the surface of the concavo-convex structure layer (20 μm in thickness) where the concavo-convex structure was formed, the ratio of the projected area of the inclined surface portions relative to the total area of the flat surface portions was 0.07. The maximum height difference between the flat surface portions was 15.1 μm. The rectangular prismoidal concave portions had a mean base edge length of 70 μm and a mean depth of 15 μm.

Electricity was applied to the resulting surface light source device 12 to emit light, and transparency of the surface light source device 12 was visually evaluated. The surface light source device 12 had an excellent transparency in the front direction and in the oblique direction.

Comparative Example 6

A surface light source device 13 was produced in the same manner as in Example 1 except that the concavo-convex structure layer was formed by using a metal mold on which square prismoidal convex portions having a base edge of 35 μm, a height of 10 μm, and a mean side surface inclination angle of 82.5° relative to the bottom surface were arranged at a pitch of 37.5 μm. In this Example, a structure having flat surface portions between adjacent convex portions was formed on the surface of the metal mold. The flat surface portions had uniform height positions.

On the surface of the concavo-convex structure layer (15 μm in thickness) where the concavo-convex structure was formed, the ratio of the projected area of the inclined surface portions relative to the total area of the flat surface portions was 0.14. The maximum height difference between the flat surface portions was 10.1 μm. The rectangular prismoidal concave portions had a mean base edge length of 35 μm and a mean depth of 10 μm.

Electricity was applied to the resulting surface light source device 13 to emit light, and transparency of the surface light source device 13 was visually evaluated. The surface light source device 13 had a poor transparency in the front direction and in the oblique direction.

Comparative Example 7

A surface light source device 14 was produced in the same manner as in Example 1 except that the concavo-convex structure layer was formed by using a metal mold on which square prismoidal convex portions having a base edge of 30

μm, a height of 5 μm, and a mean side surface inclination angle of 70° relative to the bottom surface were arranged at a pitch of 35 μm. In this Example, a structure having flat surface portions between adjacent convex portions was formed on the surface of the metal mold. The flat surface portions had uniform height positions.

On the surface of the concavo-convex structure layer (10 μm in thickness) where the concavo-convex structure was formed, the ratio of the projected area of the inclined surface portions relative to the total area of the flat surface portions was 0.2. The maximum height difference between the flat surface portions was 5.1 μm. The rectangular prismoidal concave portions had a mean base edge length of 30 μm and a mean depth of 5 μm.

Electricity was applied to the resulting surface light source device 14 to emit light, and transparency of the surface light source device 14 was visually evaluated. The surface light source device 14 had a poor transparency in the front direction and in the oblique direction.

Comparative Example 8

A surface light source device 15 was produced in the same manner as in Example 1 except that the concavo-convex structure layer was formed by using a metal mold on which square prismoidal convex portions having a base edge of 70 μm, a height of 20 μm, and a mean side surface inclination angle of 82.5° relative to the bottom surface were arranged at a pitch of 80 μm. In this Example, a structure having flat surface portions between adjacent convex portions was formed on the surface of the metal mold. Such flat surface portions had uniform height positions.

On the surface of the concavo-convex structure layer (25 μm in thickness) where the concavo-convex structure was formed, the ratio of the projected area of the inclined surface portions relative to the total area of the flat surface portions was 0.12. The maximum height difference between the flat surface portions was 20.1 μm. The rectangular prismoidal concave portions had a mean base edge length of 70 μm and a mean depth of 20 μm.

Electricity was applied to the resulting surface light source device 15 to emit light, and transparency of the surface light source device 15 was visually evaluated. The surface light source device 15 had a poor transparency in the front direction and in the oblique direction.

Comparative Example 9

A surface light source device 16 was produced in the same manner as in Example 1 except that the concavo-convex structure layer was formed by using a metal mold on which square prismoidal convex portions having a base edge of 70 μm, a height of 35 μm, and a mean side surface inclination angle of 50° relative to the bottom surface were arranged at a pitch of 140 μm. In this Example, a structure having flat surface portions between adjacent convex portions was formed on the surface of the metal mold. The flat surface portions had uniform height positions.

On the surface of the concavo-convex structure layer (40 μm in thickness) where the concavo-convex structure was formed, the ratio of the projected area of the inclined surface portions relative to the total area of the flat surface portions was 0.32. The maximum height difference between the flat surface portions was 35.1 μm. The rectangular prismoidal concave portions had a mean base edge length of 70 μm and a mean depth of 35 μm.

Electricity was applied to the resulting surface light source device 16 to emit light, and transparency of the resulting surface light source device 16 was visually evaluated. The surface light source device 16 had a poor transparency in the front direction and in the oblique direction.

<Evaluations>

The surface light source devices 9 to 16 obtained in Examples 5 to 8 and Comparative Examples 6 to 9 were evaluated for the light extraction amount and transparency in the aforementioned manner. The results are shown in Table 2.

The surface light source devices obtained in Examples 5 to 8 and Comparative Examples 6 to 9 were visually observed. As a result, although some rainbow unevenness was observed, the degree of the rainbow unevenness was less severe than a degree which is recognized as a problem in some mode of use.

TABLE 2

[Results of Examples 5-8 and Comparative Examples 1, 6-9]

| | Projected area of inclined surface/area of flat surface portions | Height difference of flat surface portions (μm) | Mean inclination angle of inclined surface(●) | Extraction amount (lm) | | | |
|---|---|---|---|---|---|---|---|
| | | | | Adhered surface | Back surface | Total | Transparency |
| Ex. 5 | 0.09 | 5.1 | 80 | 0.61 | 0.38 | 0.99 | Excellent |
| Ex. 6 | 0.03 | 15.1 | 87.5 | 0.6 | 0.32 | 0.92 | Good |
| Ex. 7 | 0.08 | 10.1 | 60 | 0.56 | 0.42 | 0.98 | Good |
| Ex. 8 | 0.07 | 15.1 | 70 | 0.55 | 0.38 | 0.93 | Good |
| Comp. Ex. 1 | | No film | | 0.22 | 0.22 | 0.44 | Good |
| Comp. Ex. 6 | 0.14 | 10.1 | 82.5 | 0.67 | 0.31 | 0.98 | Bad |
| Comp. Ex. 7 | 0.2 | 5.1 | 70 | 0.6 | 0.38 | 0.98 | Bad |
| Comp. Ex. 8 | 0.12 | 20.1 | 82.5 | 0.63 | 0.35 | 0.98 | Bad |
| Coup. Ex. s9 | 0.32 | 35.1 | 50 | 0.56 | 0.42 | 0.98 | Bad |

INDUSTRIAL APPLICABILITY

The surface light source device of the present invention is suitably used, for example, for applications such as a lighting apparatus and a backlight unit.

DESCRIPTION OF NUMERALS

10: surface light source device
10U: light output surface
10D: light output surface
100: light output surface structure layer
110: multi-layered body
111: concavo-convex structure layer
112: substrate film layer
113: flat surface portion
114: flat surface portion
115: inclined surface portion
116: concave portion
117: border between the inclined surface portions 115 and the flat surface portions 113
118: repetition structure
121: adhesive layer
131: supporting substrate
140: organic EL element
141: first transparent electrode layer
142: light-emitting layer
143: second transparent electrode layer
144: light-emitting surface
145: light-emitting surface
151: sealing substrate
20: surface light source device
20U: light output surface
200: light output surface structure layer
210: multi-layered body
211: concavo-convex structure layer
213: flat surface portion
214: flat surface portion
215: inclined surface portion
216: convex portions
218: repetition structure
30: surface light source device
40: surface light source device
40U: light output surface
400: light output surface structure layer
410: multi-layered body
411: concavo-convex structure layer
413: flat surface portion
414: flat surface portion
415: inclined surface portion
416: concave portion
511: concavo-convex structure layer
513: flat surface portion
514: flat surface portion
515: inclined surface portion
516: concave portion
517: flat surface portion
518: inclined surface portion
519: concave portion
60: surface light source device
661: inert gas layer
70U: light output surface
711: concavo-convex structure layer
713: flat surface portion
715: inclined surface portion
716: concave portion
80U: light output surface
811: concavo-convex structure layer
813: flat surface portion
814: flat surface portion
815: inclined surface portion
816: concave portion
817: flat surface portion
818: inclined surface portion
90U: light output surface
911: concavo-convex structure layer
913: flat surface portion
914: flat surface portion
915: inclined surface portion
916: concave portion

What is claimed is:

1. A surface light source device comprising: an organic electroluminescent element of a double-side emission type having a first transparent electrode layer, a light-emitting layer, and a second transparent electrode layer provided in this order; and a light output surface structure layer provided directly or indirectly on at least one surface of the organic electroluminescent element, wherein
    the light output surface structure layer includes a concavo-convex structure on a surface opposite to the organic electroluminescent element, the concavo-convex structure having flat surface portions parallel to the at least one surface of the organic electroluminescent element and an inclined surface portion tilted relative to the flat surface portions, and
    a projected area, formed by projecting the inclined surface portion in a direction perpendicular to the flat surface portions onto a plane parallel to the flat surface portions, is not more than 0.1 times a total area of the flat surface portions.

2. The surface light source device according to claim 1, wherein a maximum value of height differences among the flat surface portions in the concavo-convex structure is not more than 12 μm.

3. The surface light source device according to claim 1, wherein the inclined surface portion is tilted at an inclination angle of not less than 80° and less than 90° relative to the flat surface portions.

4. The surface light source device according to claim 1, wherein a height difference among the flat surface portions is not less than 0.1 μm.

5. A lighting apparatus comprising the surface light source device according claim 1.

* * * * *